(12) United States Patent
Lee

(10) Patent No.: US 10,643,844 B2
(45) Date of Patent: May 5, 2020

(54) SEMICONDUCTOR DEVICE AND METHOD FOR MANUFACTURING THE SAME

(71) Applicant: SK hynix Inc., Gyeonggi-do (KR)

(72) Inventor: Nam Jae Lee, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/515,954

(22) Filed: Jul. 18, 2019

(65) Prior Publication Data

US 2019/0341251 A1 Nov. 7, 2019

Related U.S. Application Data

(63) Continuation of application No. 15/815,845, filed on Nov. 17, 2017, now Pat. No. 10,403,500.

(30) Foreign Application Priority Data

Mar. 30, 2017 (KR) .......................... 10-2017-0040558

(51) Int. Cl.
| | | |
|---|---|---|
| H01L 21/02 | (2006.01) |
| H01L 27/11582 | (2017.01) |
| H01L 27/11565 | (2017.01) |
| H01L 27/11575 | (2017.01) |
| H01L 27/1157 | (2017.01) |
| H01L 21/768 | (2006.01) |

(52) U.S. Cl.
CPC .. *H01L 21/02697* (2013.01); *H01L 21/02019* (2013.01); *H01L 21/76805* (2013.01); *H01L 21/76816* (2013.01); *H01L 21/76831* (2013.01); *H01L 27/1157* (2013.01); *H01L 27/11565* (2013.01); *H01L 27/11575* (2013.01); *H01L 27/11582* (2013.01)

(58) Field of Classification Search
None
See application file for complete search history.

(56) References Cited

U.S. PATENT DOCUMENTS

2017/0117222 A1* 4/2017 Kim .................. H01L 27/11575

* cited by examiner

*Primary Examiner* — Evren Seven
(74) *Attorney, Agent, or Firm* — IP & T Group LLP

(57) ABSTRACT

Provided herein is a method for manufacturing a semiconductor device. The method may include: forming a stack including at least one first material layer and at least one second material layer which are alternately stacked; forming first holes through which the at least one first material layer is exposed; forming etch stop patterns in the respective first holes; forming at least one slit passing through the stack; replacing the at least one first material layer with at least one third material layer through the at least one slit; and forming first contact plugs in the respective first holes, the first contact plugs passing through the etch stop patterns and coupled with the at least one third material layer.

19 Claims, 26 Drawing Sheets

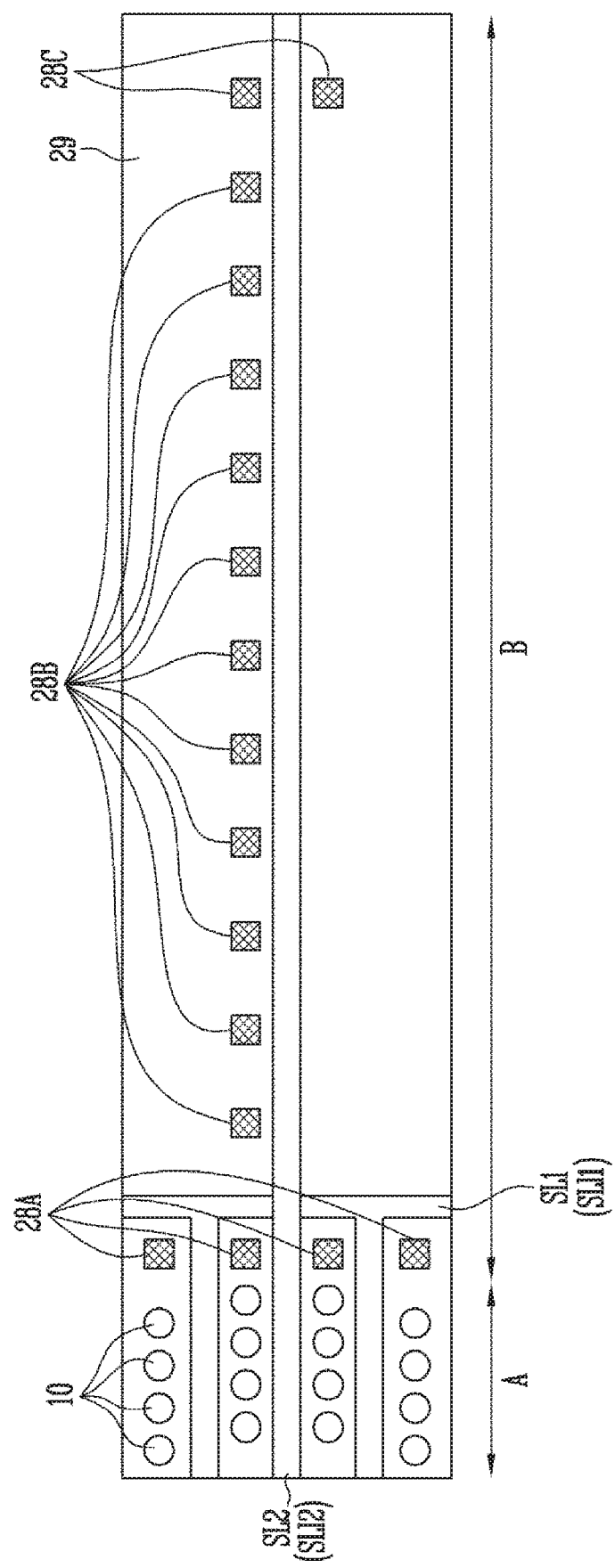

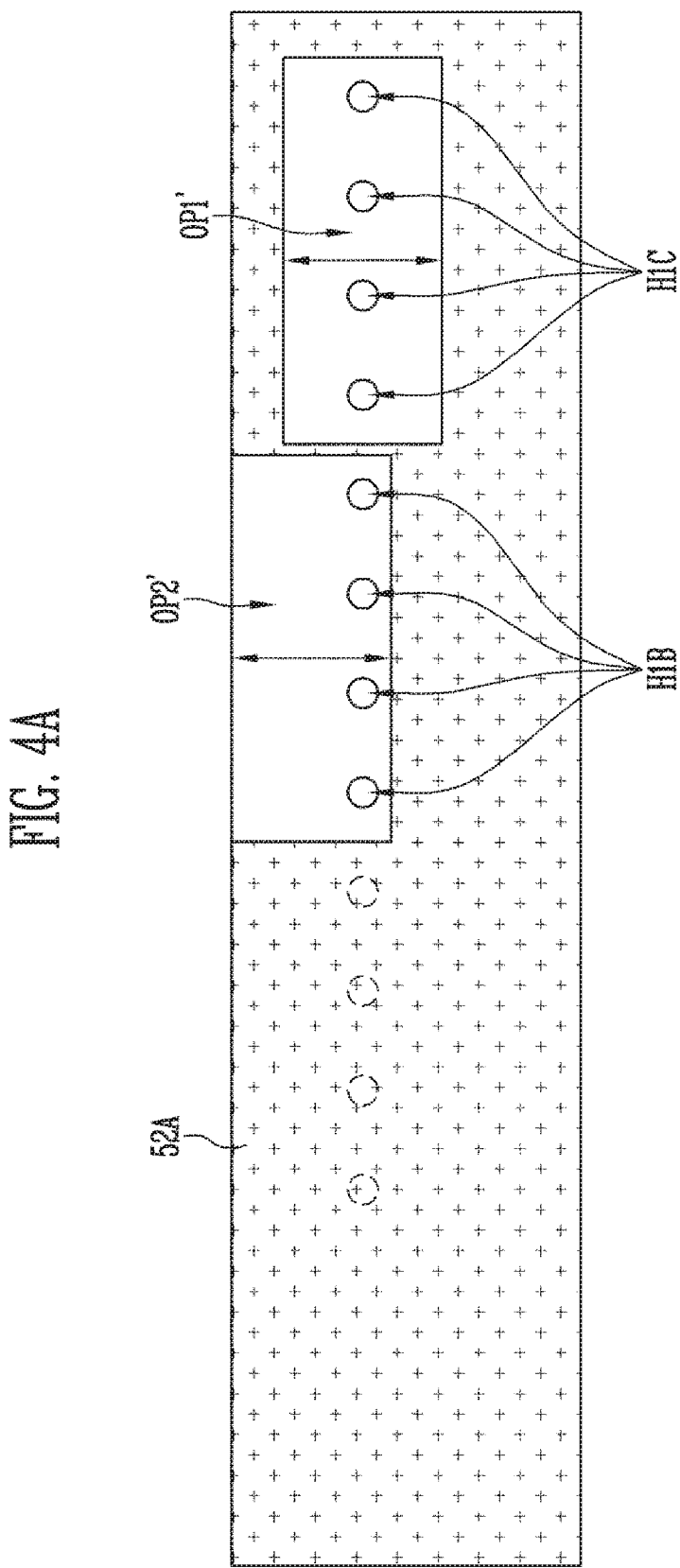

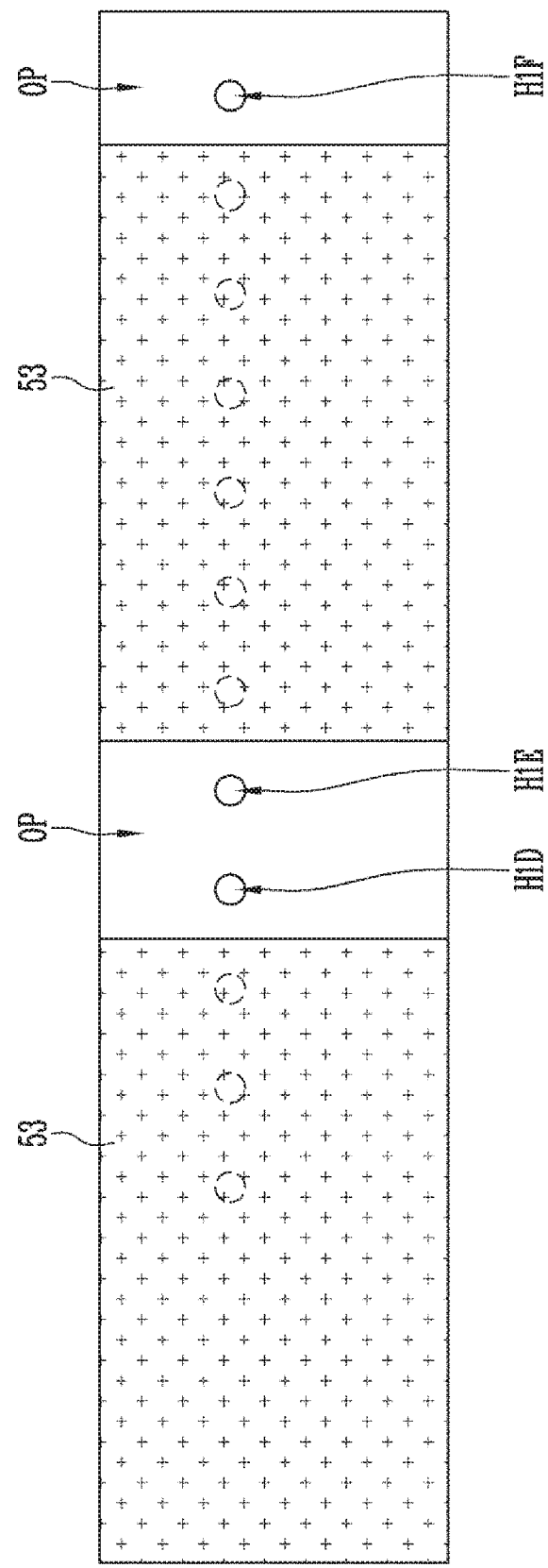

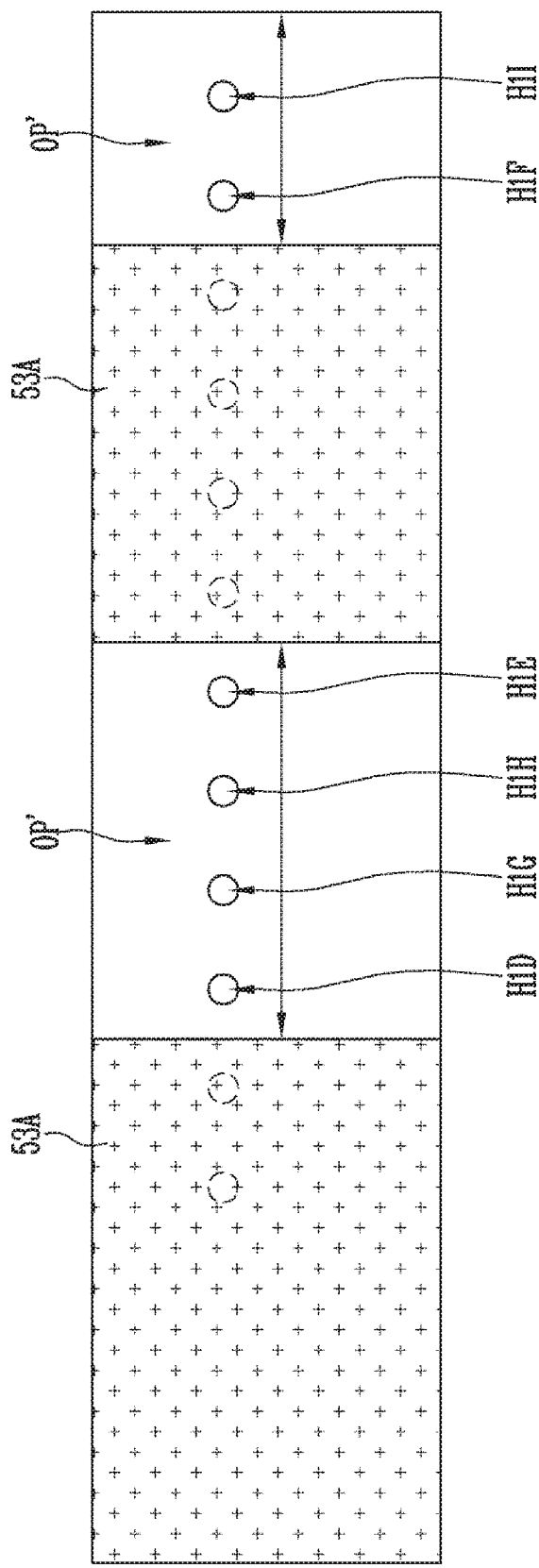

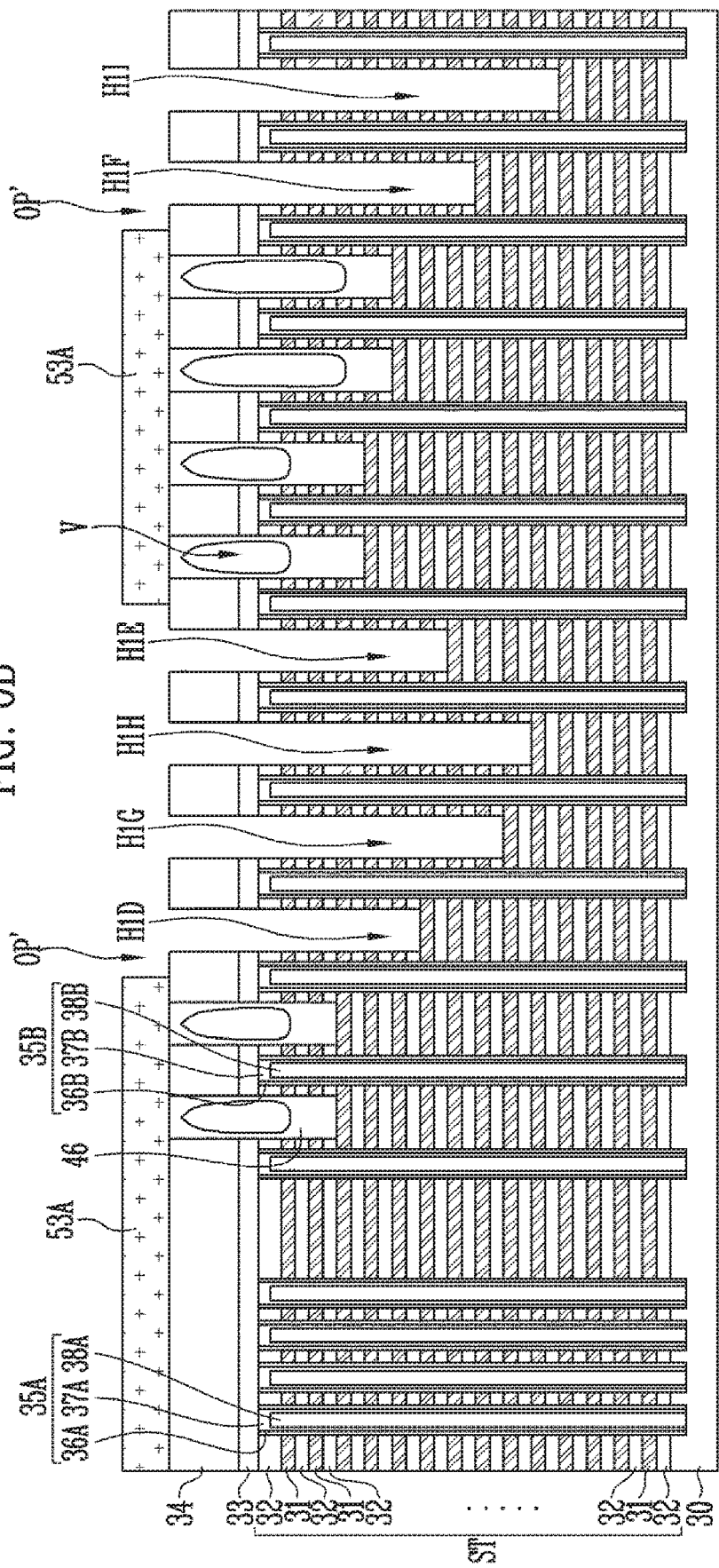

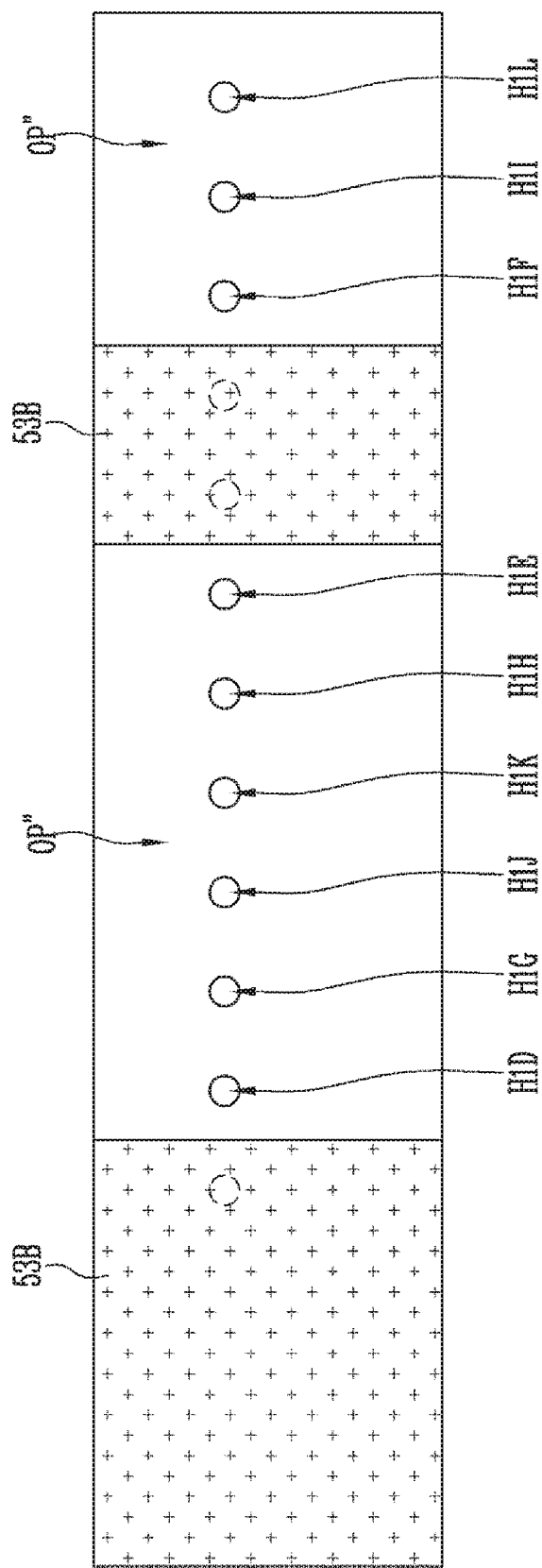

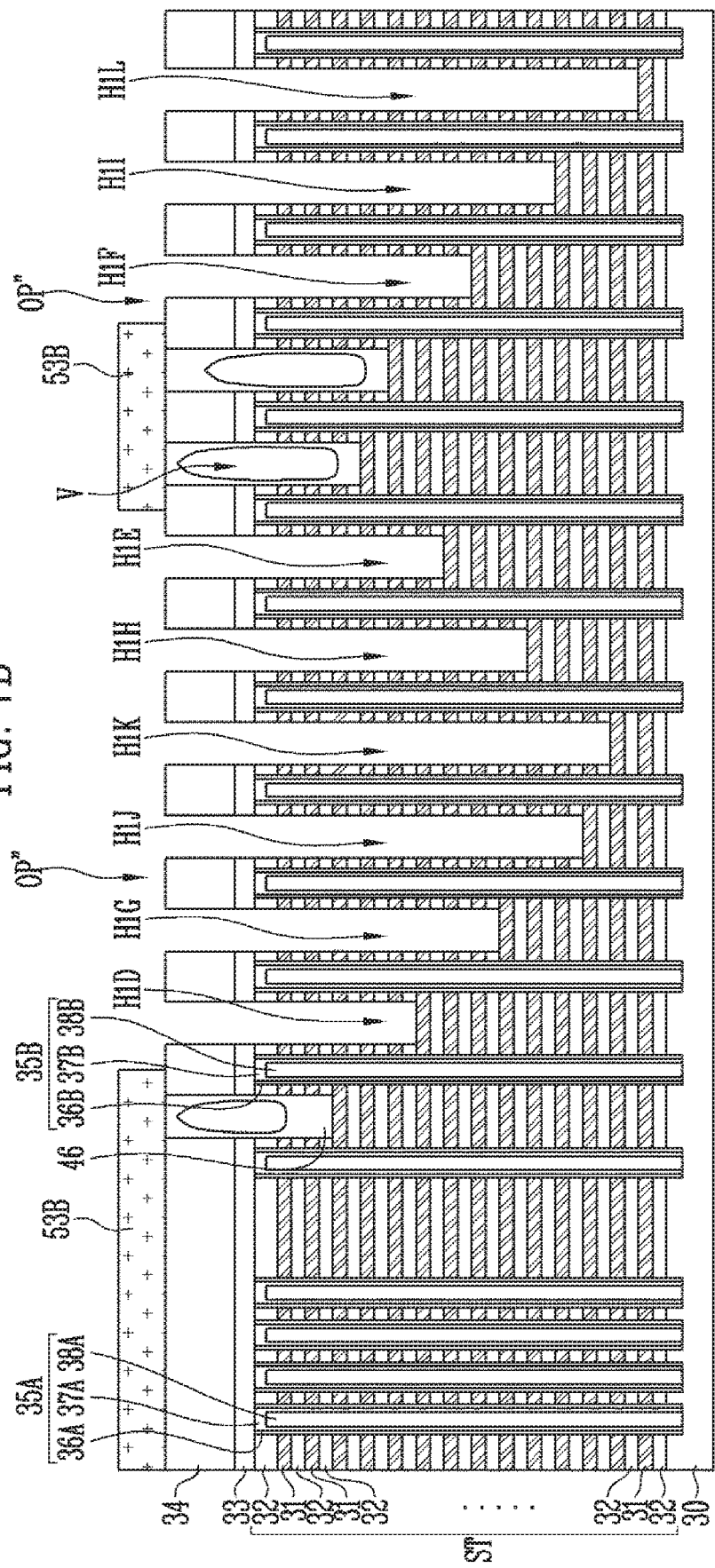

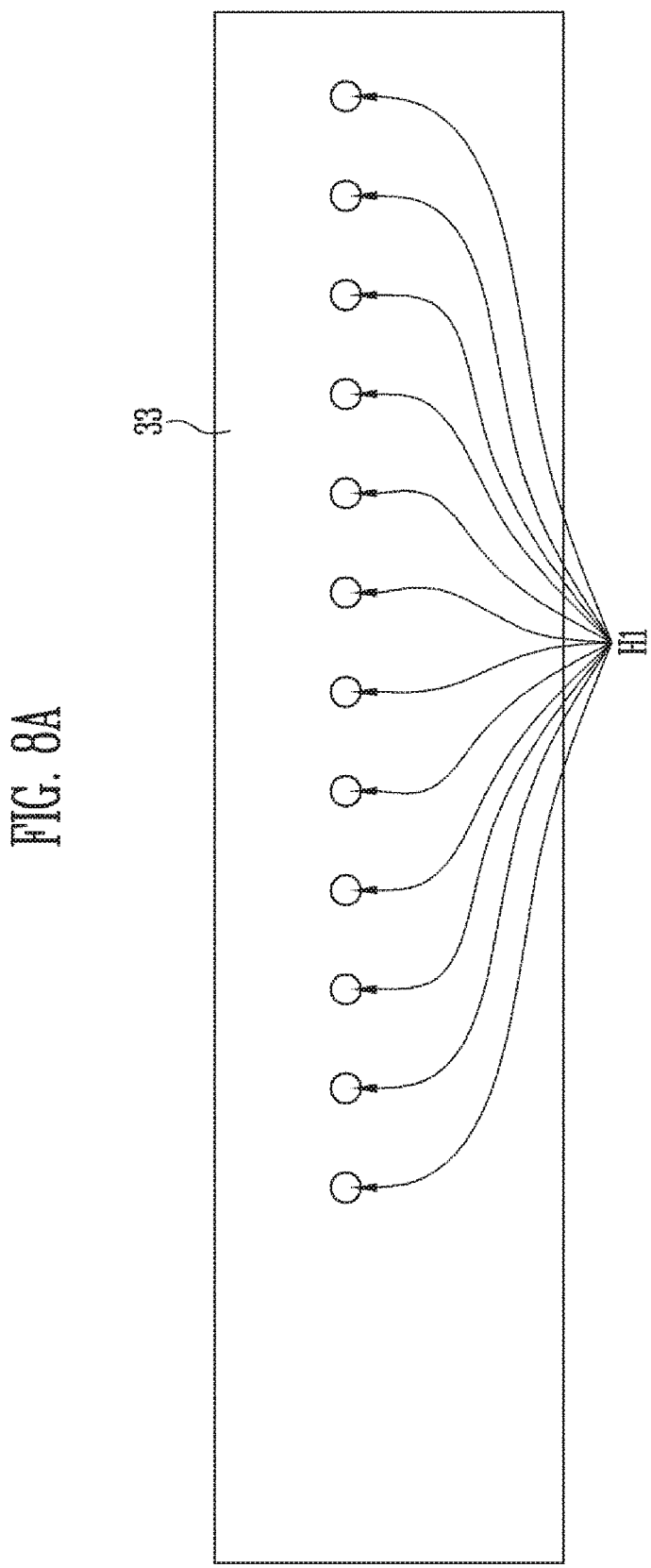

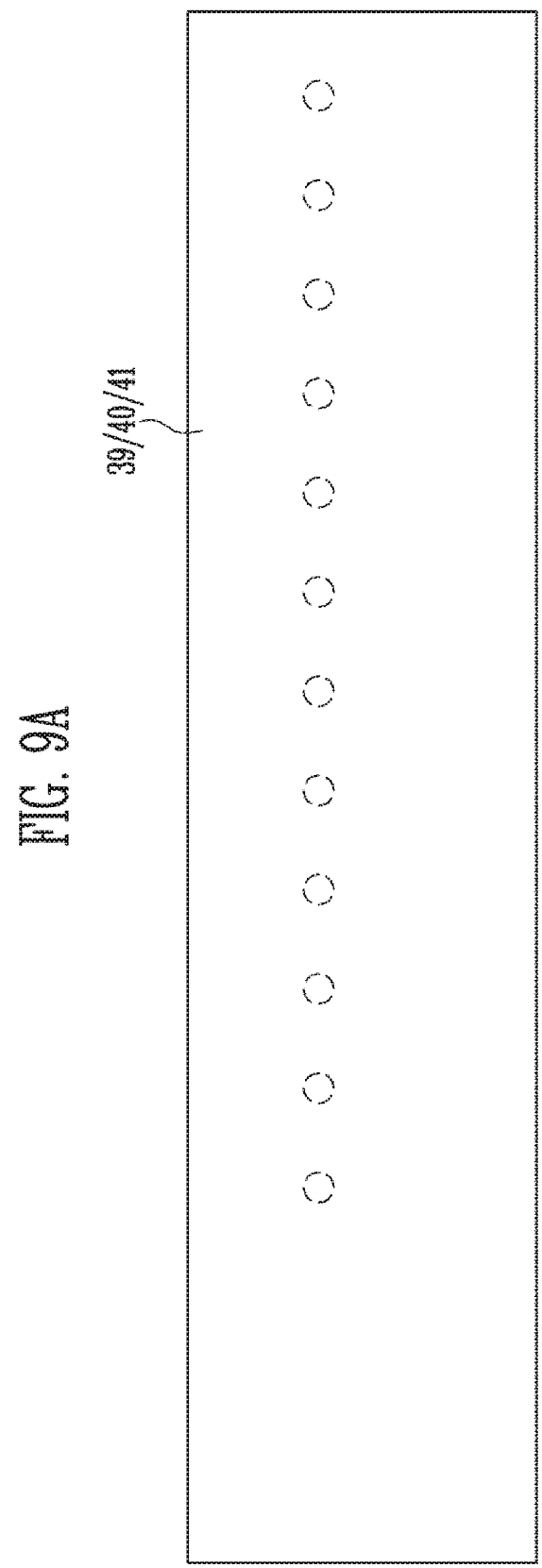

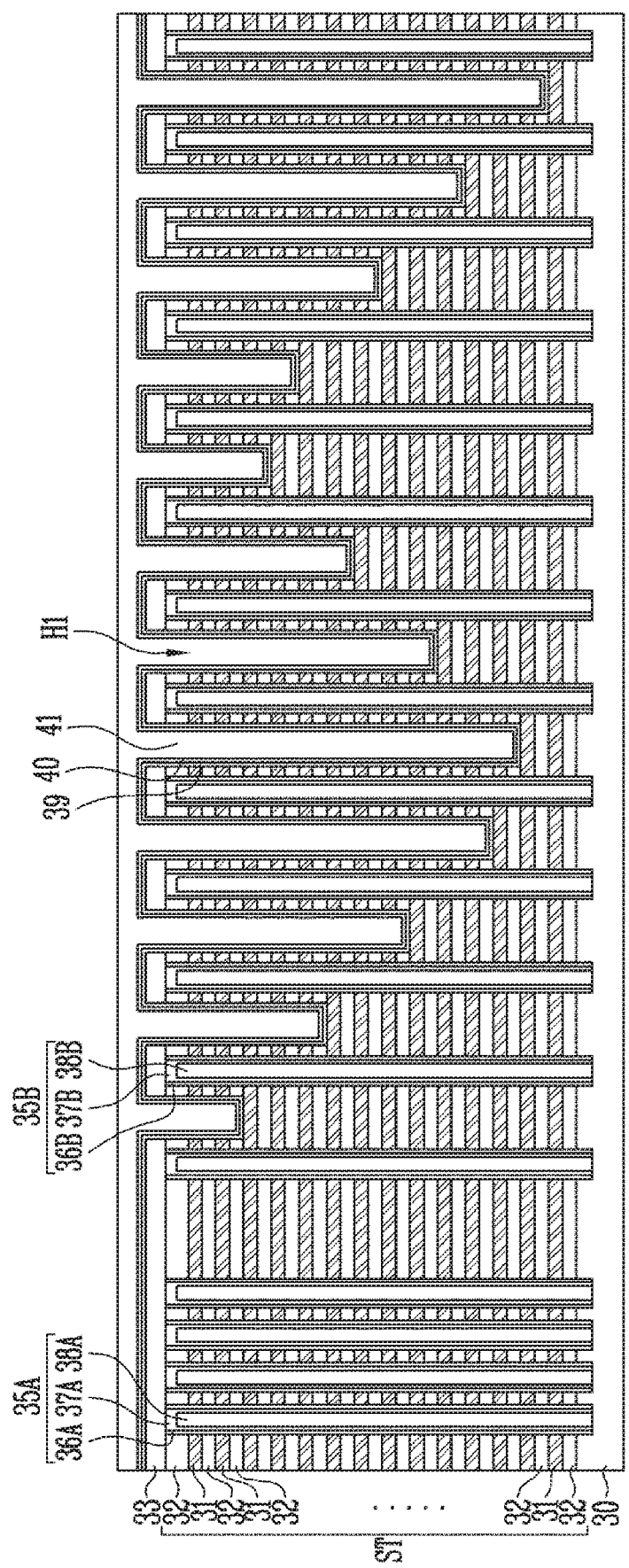

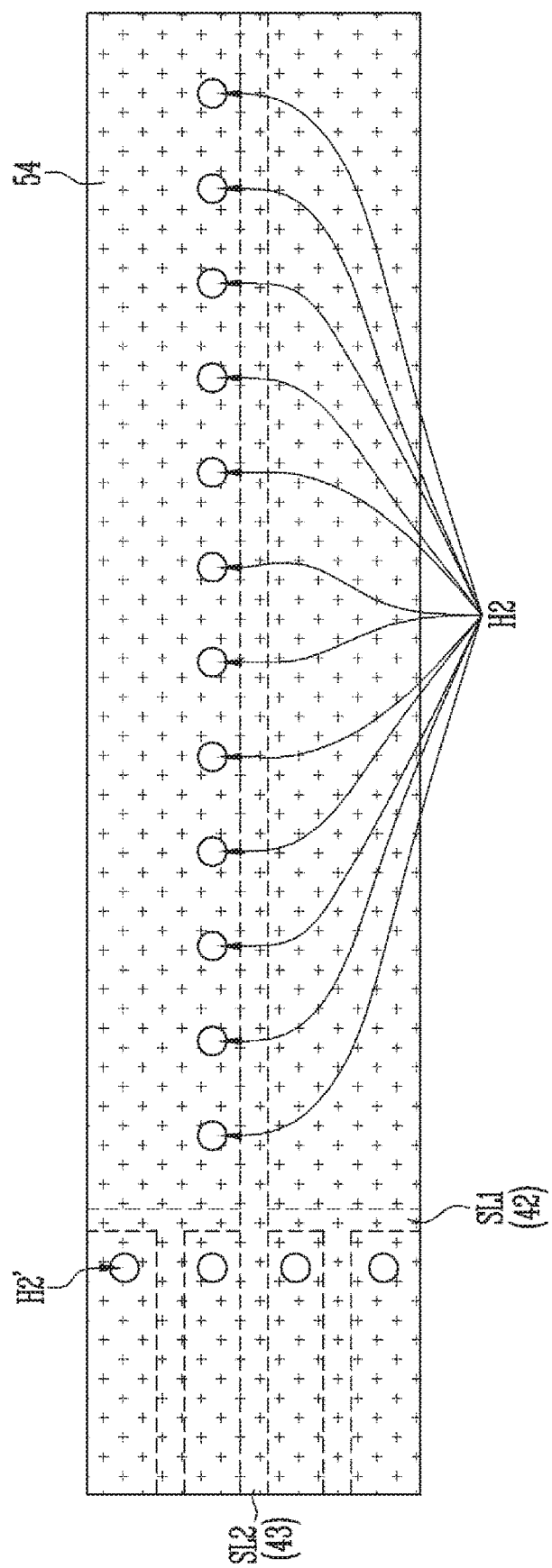

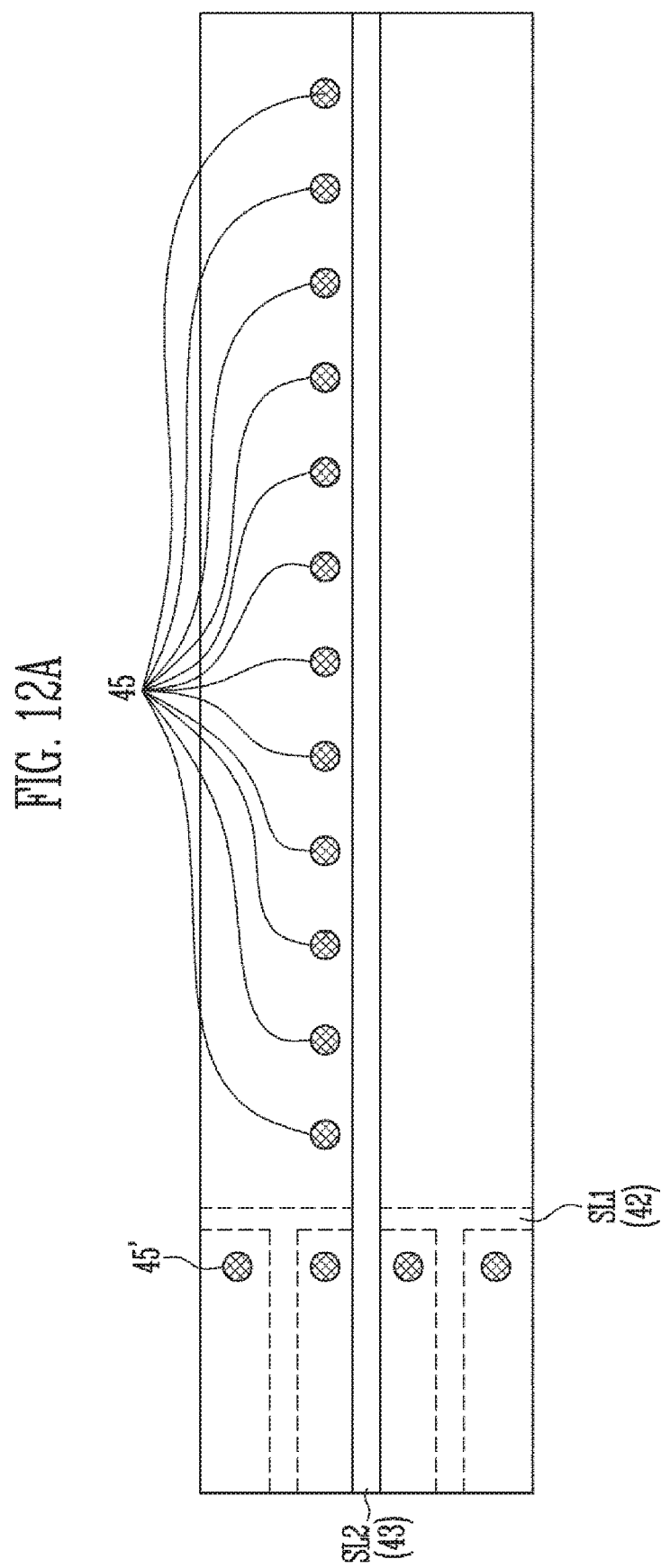

SEMICONDUCTOR DEVICE AND METHOD FOR MANUFACTURING THE SAME

CROSS-REFERENCE TO RELATED APPLICATION

This application is a continuation of U.S. patent application Ser. No. 15/815,845 filed on Nov. 17, 2017, which claims benefits of priority of Korean Patent Application No. 10-2017-0040558 filed on Mar. 30, 2017. The disclosure of each of the foregoing application is incorporated herein by reference in its entirety.

BACKGROUND

Field of Invention

Various embodiments of the present disclosure generally relate to an electronic device, and more particularly, to a semiconductor device and a method for manufacturing the same.

Description of Related Art

Non-volatile memory devices retain stored data regardless of power on/off conditions. Recently, as a two-dimensional non-volatile memory device including memory cells formed on a substrate in a single layer has reached a limit in enhancing its degree of integration, a three dimensional (3D) non-volatile memory device including memory cells stacked in a vertical direction on a substrate has been proposed.

A three-dimensional non-volatile memory device may include interlayer insulating layers and gate electrodes that are stacked alternately with each other, and channel layers passing therethrough, with memory cells stacked along the channel layers. To improve the operational reliability of such a non-volatile memory device having a three-dimensional structure, various structures and manufacturing methods have been developed.

SUMMARY

Various embodiments of the present disclosure are directed to a semiconductor device which is configured to facilitate the manufacturing to process thereof and has stable structure and improved characteristics, and a method for manufacturing the same.

An embodiment of the present disclosure may provide for a method for manufacturing a semiconductor device, including: forming a stack including at least one first material layer and at least one second material layer which are alternately stacked; forming first holes through which the at least one first material layer is exposed; forming etch stop patterns in the respective first holes; forming at least one slit passing through the stack; replacing the at least one first material layer with at least one third material layer through the at least one slit; and forming first contact plugs in the respective first holes, the first contact plugs passing through the respective etch stop patterns and coupled with the at least one third material layer.

An embodiment of the present disclosure may provide for a semiconductor device including: a stack including at least one conductive layer and at least one insulating layer which are alternately stacked; contact plugs passing through the stack to different depths; etch stop patterns enclosing respective sidewalls of the contact plugs; and protective patterns enclosing the respective etch stop patterns. The contact plugs may pass through the etch stop patterns and the protective patterns and be electrically coupled with the at least one conductive layer.

BRIEF DESCRIPTION OF THE DRAWINGS

FIGS. 1A and 1B are diagrams illustrating the structure of a semiconductor device in accordance with an embodiment of the present disclosure.

FIGS. 2A to 12A and 2B to 12B are views illustrating a method for manufacturing a semiconductor device in accordance with an embodiment of the present disclosure.

DETAILED DESCRIPTION

Figure 1B:
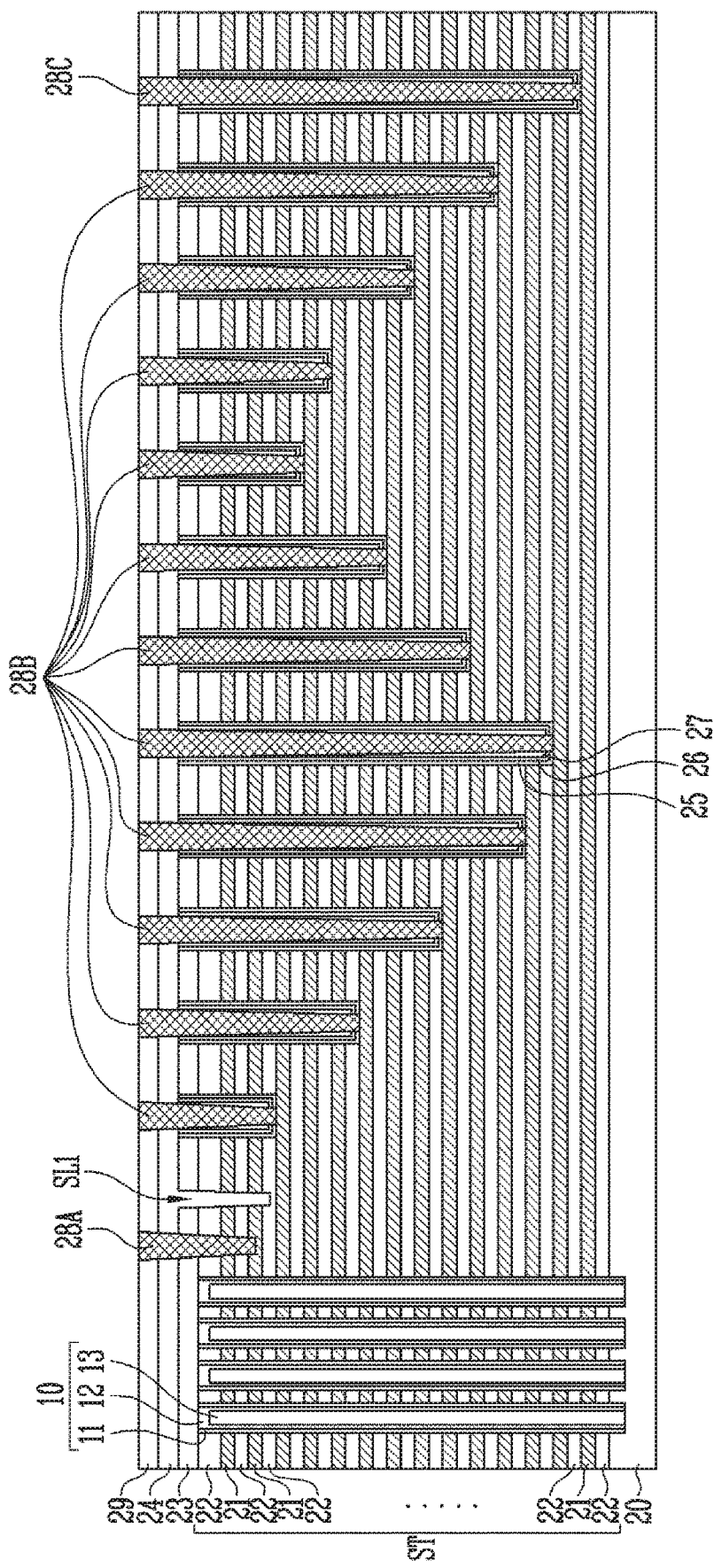

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing, figures and dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments and intermediate structures. As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural form as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. Alternatively, "directly connected/directly coupled" refers to one component directly coupling another component without an intermediate component.

FIGS. 1A and 1B are diagrams illustrating the structure of a semiconductor device according to an embodiment of the present disclosure. FIG. 1A is a layout diagram. FIG. 1B is a sectional view.

Referring to FIGS. 1A and 1B, a semiconductor device according to an embodiment of the present disclosure may include a stack ST, etch stop patterns 26, and contact plugs 28A to 28C. Furthermore, the semiconductor device may further include a substrate 20, a channel structure 10, protective patterns 25, sacrificial patterns 27, a dummy structure, and so forth.

The stack ST may include a cell region A and a contact region B. The contact region B may be provided on one side of the cell region A or disposed on each of the opposite sides thereof. Alternately, the cell region A may be disposed on each of the opposite sides of the contact region B. A memory string including stacked memory cells may be disposed in the cell region A. In an embodiment, the memory string may include at least one source select transistor, a plurality of memory cells, and at least one drain select transistor which are coupled in series, and may be vertically formed on the substrate 20. In an embodiment, the memory string may include at least one source select transistor, a plurality of memory cells, at least one pipe transistor, a plurality of memory cells, and at least one drain select transistor which are coupled in series, and may be formed in a shape such as a U shape, or a W shape. An interconnection structure such as a pad, a contact plug, and a line for driving the memory string may be disposed in the contact region B.

The stack ST may include conductive layers 21 and insulating layers 22 which are alternately stacked on the substrate 20. Each of the conductive layers 21 may be a polysilicon layer or a metal layer formed of material such as tungsten, or tungsten nitride. Each of the insulating layers 22 may be an oxide layer.

The conductive layers 21 of the cell region A may be gate electrodes of a select transistor, memory cells, and the like. The conductive layers 21 of the contact region B may be lines or pads. For example, at least one lowermost conductive layer 21 may be a source select line, at least one uppermost conductive layer 21 may be a drain select line, and the other conductive layers 21 may be word lines.

The substrate 20 may include a source layer or a source region. In an embodiment, a source layer may be interposed between the substrate 20 and the stack ST. The source layer may be a polysilicon layer, a metal layer, or the like. In an embodiment, a source region may be an impurity region formed by doping an impurity into the substrate.

The channel structure 10 may pass through the stack ST in the cell region A, and come into contact with the source layer or the source region. For example, the channel structure 10 may include a channel layer 12, a memory layer 11 enclosing the sidewall of the channel layer 12, and a gap fill layer 13 formed in the channel layer 12. The channel layer 12 may be a semiconductor layer including silicon (Si), germanium (Ge), etc. The memory layer 11 may include at least one of a tunnel insulating layer, a data storage layer and a charge blocking layer, and include a floating gate, a charge trap layer, silicon, nitride, phase-change material, nanodots, etc. The gap fill layer 13 may be an oxide layer formed of material such as polysilazane (PSZ).

Although not shown in the drawings, a dummy structure similar to the channel structure 10 may be disposed in the contact region B. The dummy structure may pass through the stack ST in the contact region B, and come into contact with the source layer or the source region. For example, the dummy structure may include a dummy channel layer, a dummy memory layer enclosing the sidewall of the dummy channel layer, and a dummy gap fill layer formed in the dummy channel layer. The dummy structure may be disposed between the contact plugs 28A to 28C, and function to support the stack ST during a manufacturing process.

Each of the contact plugs 28A to 28C may penetrate the stack ST and is electrically coupled with a corresponding one of the conductive layers 21. Since the stack ST in the contact region B has a flat upper surface, upper surfaces of the contact plugs 28A to 28C are substantially disposed on the same level, and the contact plugs 28A to 28C penetrate the stack ST to different depths.

At least one first contact plug 28A may be electrically coupled with at least one drain select line. In the case in which a plurality of drain select lines are stacked, the first contact plug 28A may come into contact with the plurality of drain select lines. Therefore, the same bias may be applied to the plurality of drain select lines.

The plurality of second contact plugs 28B may be electrically coupled with respective word lines. Therefore, the sidewalls of each of the second contact plugs 28B may be enclosed by the respective etch stop patterns 26 and the respective protective patterns 25. Each of the second contact plugs 28B may penetrate the bottom of the corresponding etch stop pattern 26 and protective pattern 25, and come into contact with the corresponding one word line.

At least one third contact plug 28C may be electrically coupled with at least one source select line. Therefore, the sidewall of the third contact plug 28C may be enclosed by the corresponding etch stop pattern 26 and the corresponding protective pattern 25. The third contact plug 28C may penetrate the bottom of the etch stop pattern 26 and protect pattern 25, and come into contact with the corresponding one source select line.

The etch stop patterns 26 may be used as etch stop layers during the process of forming holes, and function to insulate the contact plugs 28B and 28C from the conductive layers 21. The protective patterns 25 may prevent the etch stop patterns 26 from being damaged during a process of replacing sacrificial layers with the conductive layers 21, and function to insulate the contact plugs 28B and 28C from the conductive layers 21. For example, the etch stop patterns 26 may enclose the respective sidewalls of the contact plugs 28A to 28C, and the protective patterns 25 may enclose the respective etch stop patterns 26. Sacrificial patterns 27 may remain between the contact plugs 28B and 28C and the etch stop patterns 26.

Upper surfaces of the etch stop patterns 26 may be disposed on a level lower than those of the contact plugs 28B and 28C. A first interlayer insulating layer 23, a second interlayer insulating layer 24 and a third interlayer insulating layer 29 may be successively stacked on the stack ST. Each of the etch stop patterns 26 passes through a portion of the stack ST and the first interlayer insulating layer 23. Each of the contact plugs 28B and 28C may pass through a portion of the stack ST and the first to third interlayer insulating layers 23, 24 and 29. In this case, the upper surfaces of the etch stop patterns 26 may be disposed on substantially the same level as that of the first interlayer insulating layer 23. The upper surfaces of the contact plugs 28B and 28C may be disposed on substantially the same level as that of the third interlayer insulating layer 29. Upper surfaces of the sacrificial patterns 27 and the 10o protective patterns 25 may be disposed on substantially the same level as those of the etch stop patterns 26.

Furthermore, the upper surfaces of the etch stop patterns 26 may be disposed at a position higher than those of the channel structures 10. For instance, each of the channel structures 10 may penetrate the stack ST, and the upper surfaces of the channel structures 10 may be disposed on the same level as that of the stack ST. Therefore, the upper surfaces of the channel structures 10 may be disposed at a position lower than those of the etch stop patterns 26, the sacrificial patterns 27, the protective patterns 25 and the contact plugs 28A to 28C.

Each of first slits SL1 may penetrate the stack ST to a predetermined depth, and a first slit insulating layer SLI1 may be formed in each first slit SL1. For example, a portion of the second interlayer insulating layer 24 may be the first slit insulating layer SLI1. The first slits SL1 may function to insulate select lines disposed on the same level, from each other. In the case in which at least one uppermost conductive layer 21 is a drain select line, each of the first slits SL1 may have a predetermined depth to pass through the drain select line.

A second slit SL2 may have a depth sufficient to completely penetrate the stack ST, and a second slit insulating layer SLI2 may be formed in the second slit SL2. For example, a portion of the third interlayer insulating layer 29 may be the second slit insulating layer SLI2. The second slit SL2 may be used as a passage used for replacing the sacrificial layers with the conductive layers 21 during the manufacturing process. In the case in which a peripheral circuit is disposed below the substrate 20, the interconnection structure which is coupled to the peripheral circuit may pass through the second slit SL2.

The contact plugs 28A to 28C may be disposed on only one side of the second slit SL2, or distributed on opposite sides of the second slit SL2. For example, the first contact plugs 28A may be disposed between the first slits SL1. The second contact plugs 28B may be disposed on only one side of the second slit SL2. The third contact plugs 28C may be disposed on the respective opposite sides of the second slit SL2.

According to above-described configuration, the stack ST may have a uniform height. The cell region A and the contact region B may substantially have the same height, and the contact region B may generally have a uniform height. Consequently, even when stress is caused during the manufacturing process, the stress is uniformly dispersed into the stack ST, whereby the stack ST may be prevented from inclining or collapsing.

FIGS. 2A to 12A and 2B to 12B are views illustrating a method for manufacturing a semiconductor device according to an embodiment of the present disclosure. The drawings attached with reference character A for example, FIGS. 2A, 3A, . . . 12A, are layout diagrams, the drawings attached with reference character B for example, FIGS. 2B, 3B, . . . 12B, are sectional views. The illustration of the layout diagrams will be focused on the positions of a hole, a mask pattern and a contact plug, and the other configurations will be omitted.

Figure 2A:
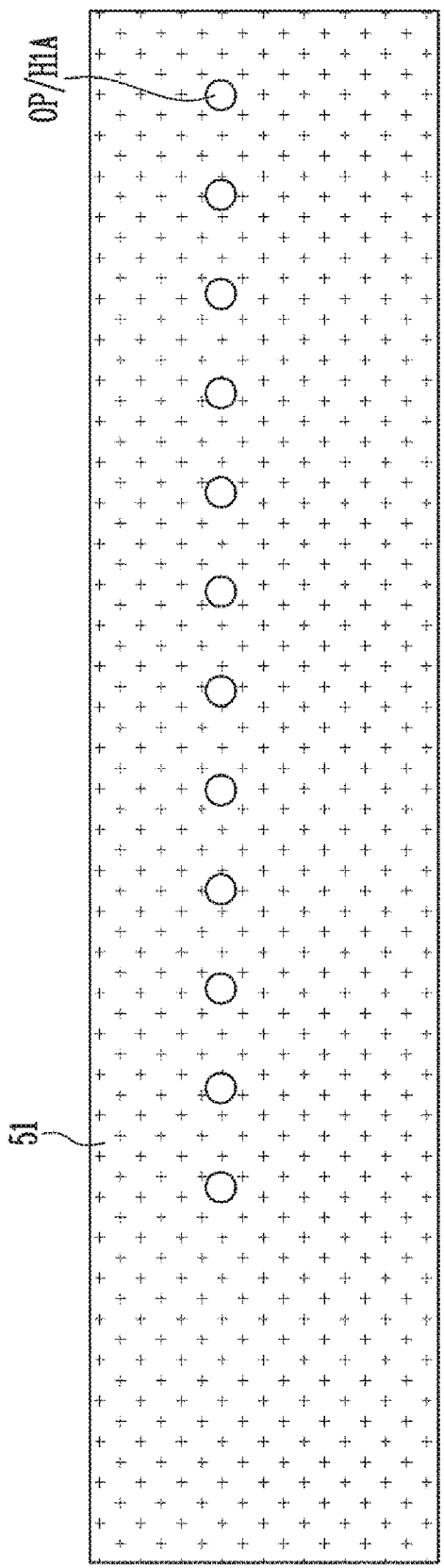
Figure 2B:
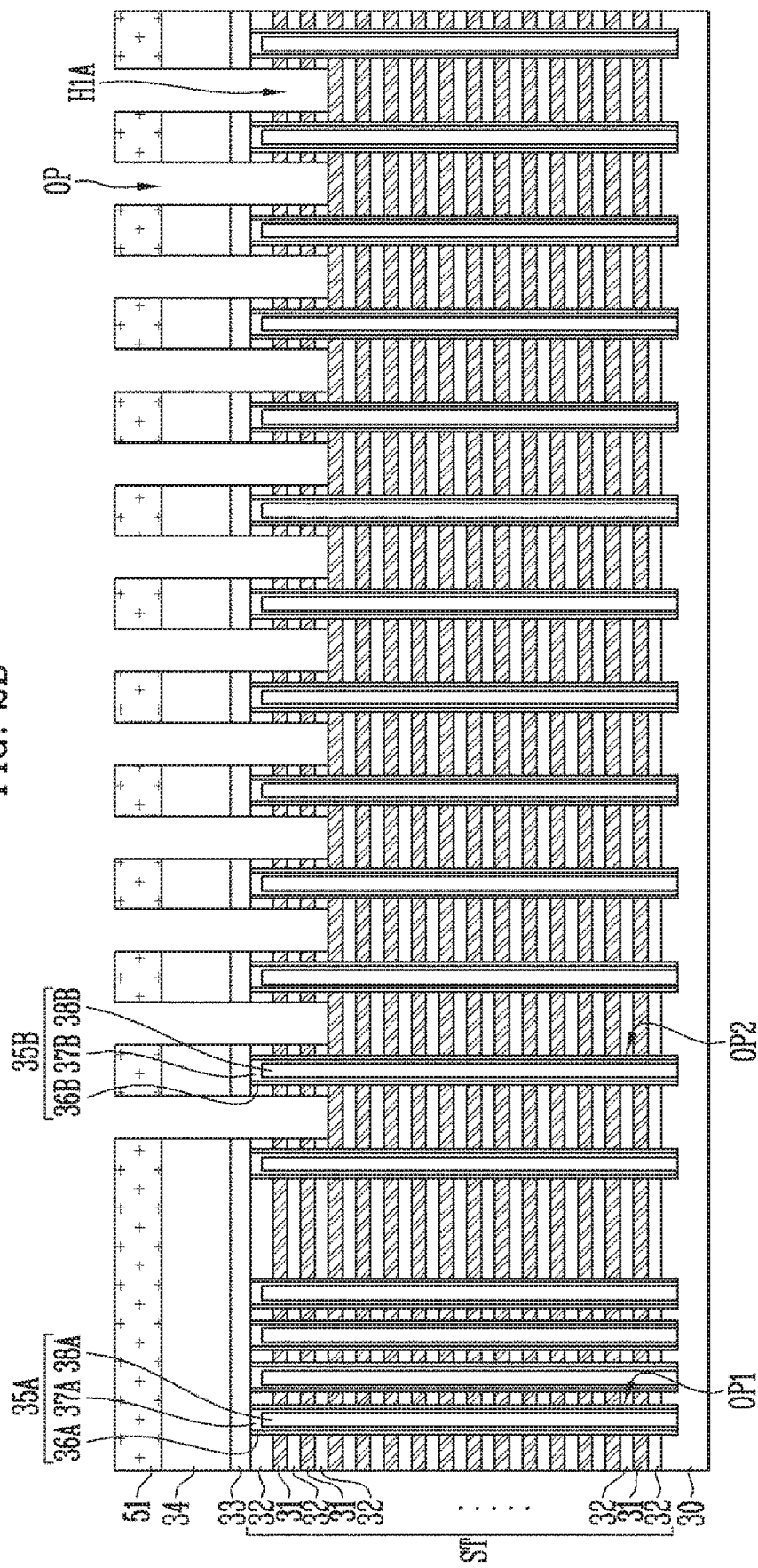

Referring to FIGS. 2A and 2B, a stack ST is formed by alternately stacking first material layers 31 and second material layers 32. The stack ST may be provided to form memory strings including memory cells which are vertically stacked, and may have a shape having a high aspect ratio.

The first material layers 31 may be provided to form gate electrodes of memory cells, select transistors, and the like. The second material layers 32 may be provided to insulate the stacked gate electrodes from each other. The first material layers 31 may include material having a high etch selectivity to the second material layers 32. For example, the first material layers 31 may be sacrificial layers including nitride or the like, and the second material layers 32 may be insulating layers including oxide or the like. Alternatively, the first material layers 31 may be conductive layers including polysilicon, tungsten, or the like, and the second material layers 32 may be insulating layers including oxide or the like. As a further alternative, the first material layers 31 may be conductive layers including doped polysilicon or the like, and the second material layers 32 may be sacrificial layers including undoped polysilicon or the like.

Subsequently, first and second openings OP1 and OP2 are formed passing through the stack ST. Each of the first openings OP1 may be provided to form a channel structure 35A, and be disposed on the cell region A. Each of the second openings OP2 may be provided to form a dummy structure 35B, and be disposed on the contact region B. The first openings OP1 and the second openings OP2 may be formed together. Each of the first openings OP1 and the second openings OP2 may have a depth sufficient to completely pass through the stack ST and expose the substrate 30.

Thereafter, the channel structures 35A are formed in the respective first openings OP1, and the dummy structures 35B are formed in the respective second openings OP2. Each of the channel structures 35A may include a channel layer 37A, and a memory layer 36A enclosing the sidewall of the channel layer 37A. The channel layer 37A may be filled with a gap fill layer 38A. Each of the dummy structures 35B may include a dummy channel layer 37B, and a dummy memory layer 36B enclosing the sidewall of the dummy channel layer 37B. The dummy channel layer 37B may be filled with a dummy gap fill layer 38B. The channel layer 37A and the dummy channel layer 37B may be formed together. The memory layer 36A and the dummy memory layer 36B may be formed together. The gap fill layer 38A and the dummy gap fill layer 38B may be formed together.

Subsequently, a first interlayer insulating layer 33 is formed on the stack ST, and a hard mask layer is thereafter formed on the first interlayer insulating layer 33. The hard mask layer may be a polysilicon layer. Furthermore, since the hard mask layer functions as a mask pattern during etching processes to be repeated during a following process, the hard mask layer may have a sufficient thickness, taking into account the thickness of a portion of the hard mask layer which is damaged during the etching processes to be repeated.

Subsequently, a first mask pattern 51 including openings OP is formed on the hard mask layer. The hard mask layer and the first interlayer insulating layer 33 are etched using the first mask pattern 51 as an etch barrier. In this way, a hard mask pattern 34 is formed.

Thereafter, the stack ST is partially etched using the first mask pattern 51 and the hard mask pattern 34 as an etch barrier so that preliminary first-holes H1A are formed. The preliminary first-holes H1A may have a uniform depth, and be aligned and arranged in one direction. The corresponding first material layer 31 may be exposed through the bottoms of the preliminary first-holes H1A.

Each of the preliminary first-holes H1A may have a depth sufficient to pass through at least two first-material layers 31. For example, the preliminary first-holes H1A may be formed to a depth at which the first material layer 31 to be used for an uppermost word line is exposed. When each memory string includes two drain select transistors, each of the preliminary first-holes H1A may be formed to a depth at which it penetrates the two first-material layers 31 from the uppermost end of the stack ST and exposes the third first-material layer 31.

Figure 3A:
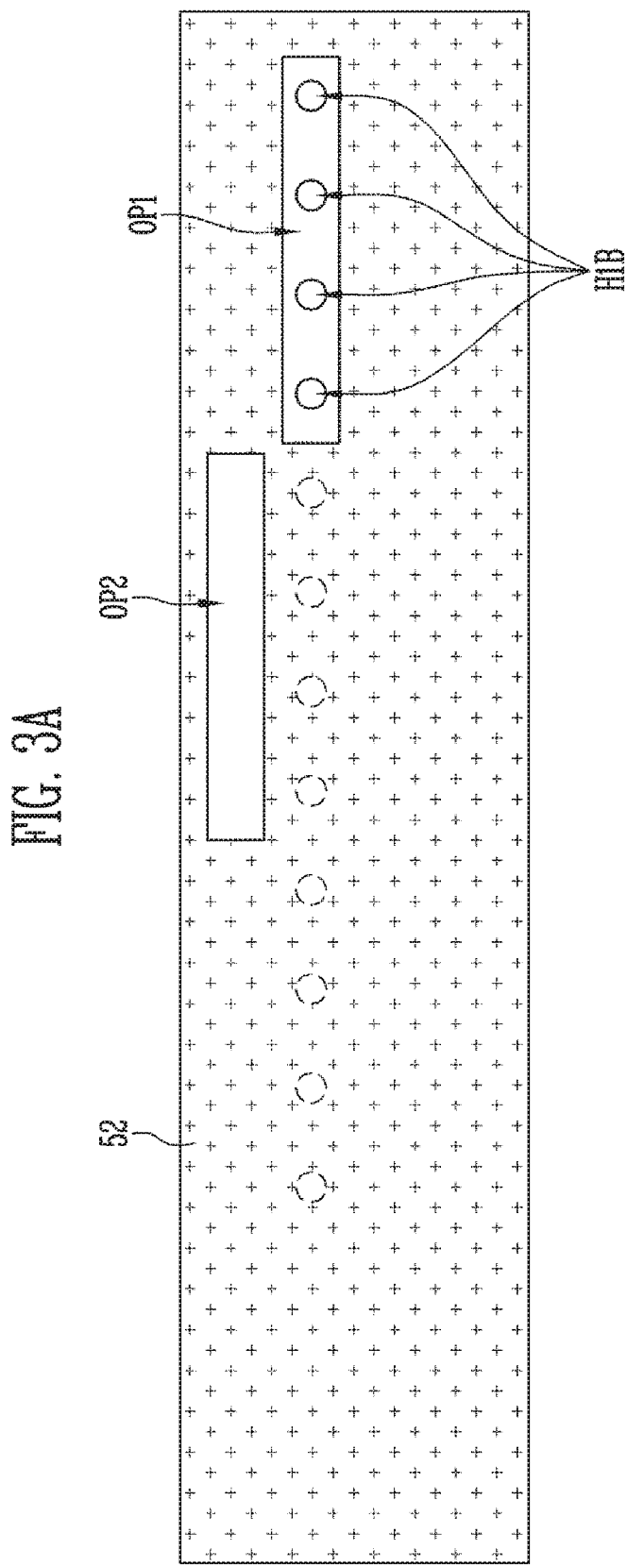
Figure 3B:
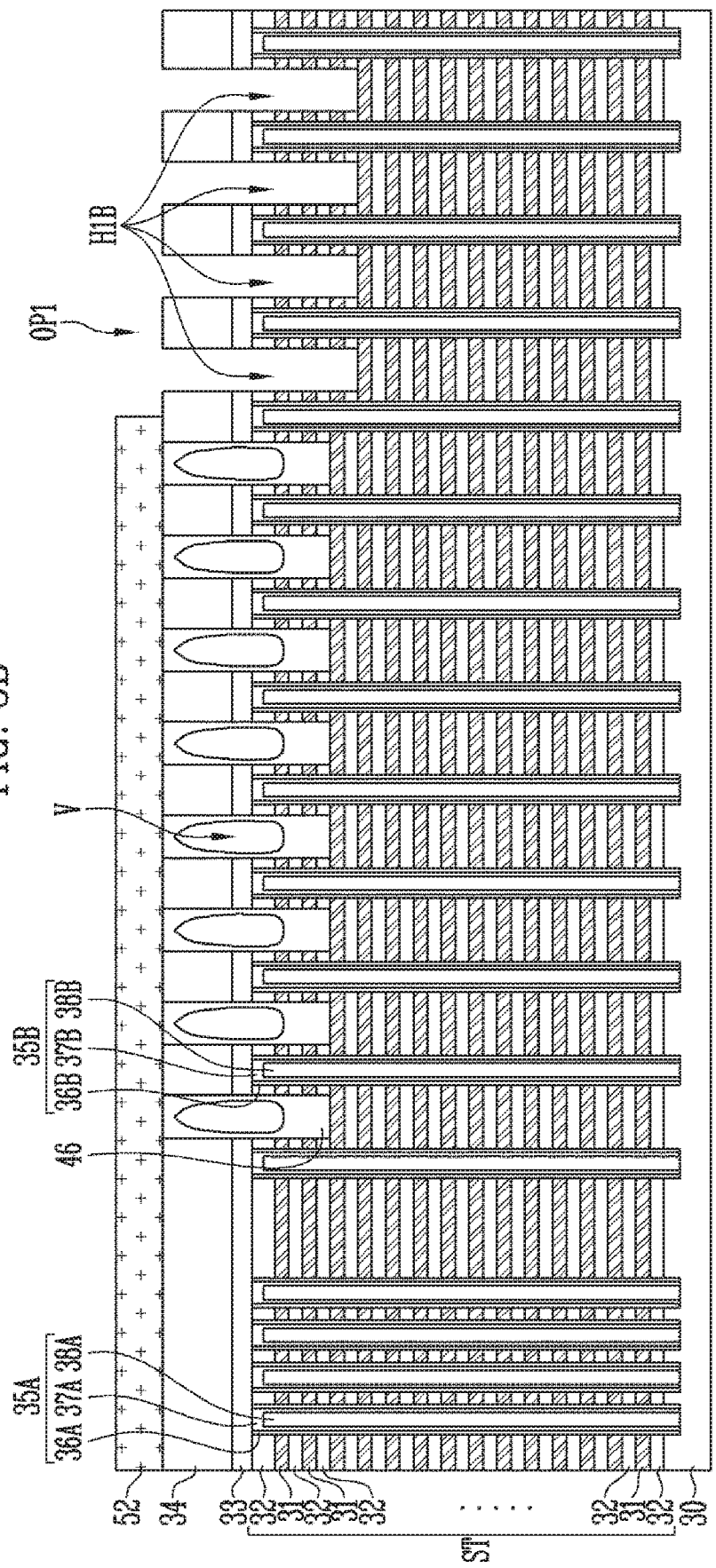

Referring to FIGS. 3A and 3B, the first mask pattern 51 of FIGS. 2A and 2B may be removed, and sacrificial patterns 46 may be thereafter formed in the preliminary first-holes H1A. For example, the sacrificial patterns 46 may be formed through a process of: forming a sacrificial layer on the stack ST such that the preliminary first-holes H1A are filled with the sacrificial layer; and planarizing the sacrificial layer such that the upper surface of the stack ST is exposed. Each of the sacrificial patterns 46 may be an amorphous carbon layer. Each of the sacrificial patterns 46 may include a void V. Therefore, the sacrificial patterns 46 may be removed without using a separate removing process when a peripheral layer, for example, a photoresist layer, is removed.

Thereafter, a second mask pattern 52 including first and second island-type openings OP1 and OP2 may be formed. The second mask pattern 52 may be a photoresist pattern. The first opening OP1 may be disposed such that some of the preliminary first-holes H1A are exposed. The second opening OP2 may be disposed such that the preliminary first-holes H1A are not exposed, and may be misaligned with the first opening OP1. The first opening OP1 and the second opening OP2 may have substantially the same size.

Subsequently, the stack ST may be etched to a predetermined depth using the second mask pattern 52 and the hard mask pattern 34 as etch barriers. Consequently, the preliminary first-holes H1A may extend downward. For example, a single first material layer 31 and a single second material layer 32 may be etched. The corresponding first material layer 31 may be exposed through the bottoms of the extended preliminary first-holes H1B.

Figure 4B:
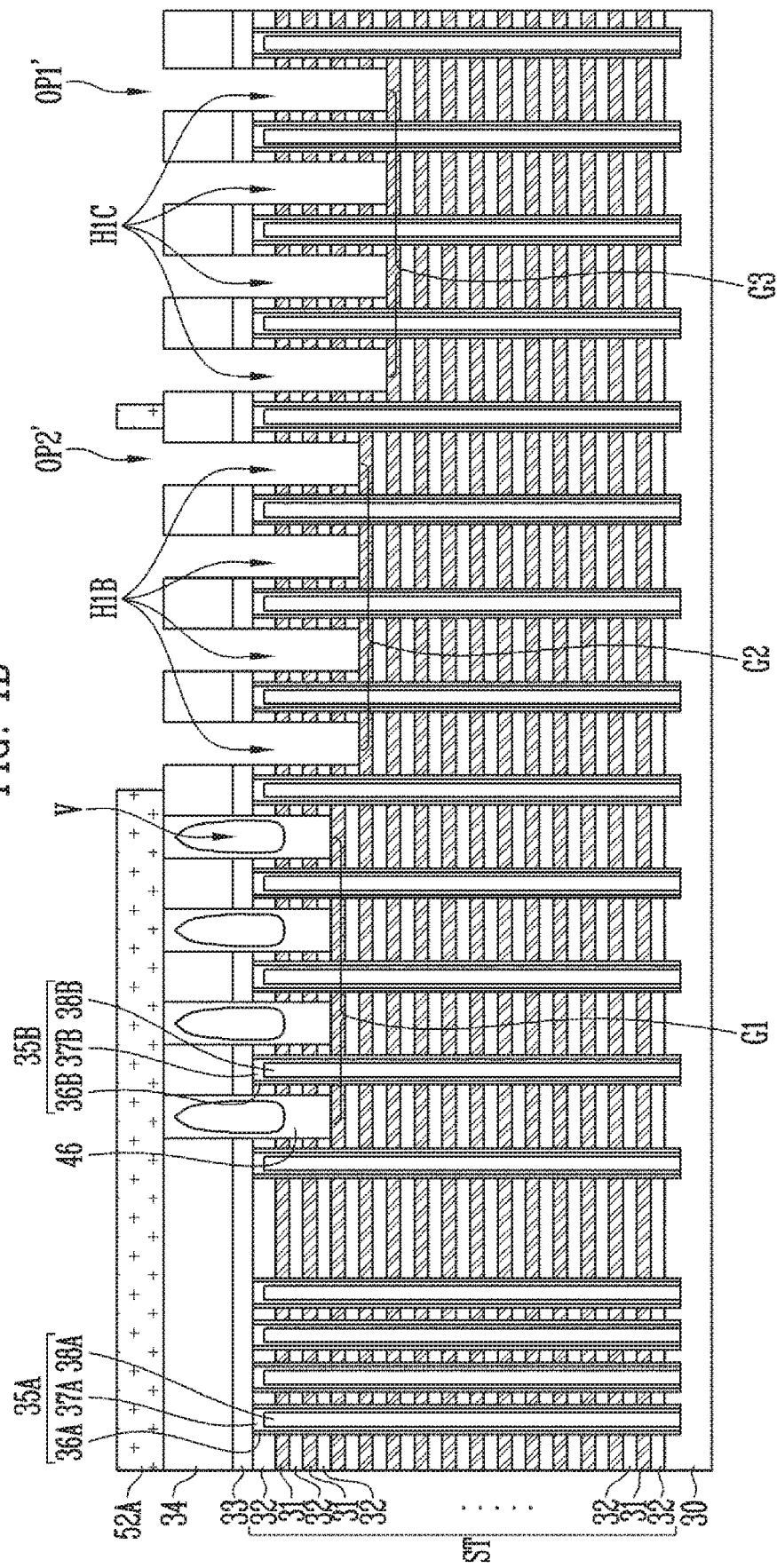

Referring to FIGS. 4A and 4B, the first and second openings OP1 and OP2 may expand. For instance, the first and second openings OP1 and OP2 may be expanded by etching a portion of the second mask pattern 52 of FIGS. 3A and 3B. The first and second openings OP1 and OP2 may expand in one direction (refer to the arrow). Some of the preliminary first-holes H1A may be additionally exposed through a second expanded opening OP2'.

Thereafter, the stack ST may be etched to a predetermined depth using, as etch barriers, the hard mask pattern 34 and a second mask pattern 52A which includes the first and second expanded openings OP1' and OP2'. For example, a single first material layer 31 and a single second material layer 32 may be etched. Thereby, the preliminary first-holes H1A exposed through the second expanded opening OP2' may extend downward, and the preliminary first-holes H1B exposed through the first expanded opening OP1' may extend downward. As a result, preliminary first-holes H1B and H1C may be formed.

The second mask pattern 52 may further include openings. The operation of expanding the openings and etching the stack ST to a predetermined depth may be repeatedly performed several times. Some of the openings may be formed at positions at which the preliminary first-holes H1A may not be exposed. However, as the openings expand, the preliminary first-holes H1A may be successively exposed through the expanded openings. Therefore, the preliminary first-holes H1A may extend to various depths.

In an embodiment, when the second mask pattern 52 includes N openings, N+1 groups of preliminary first-holes which have different depths may be formed by etching the stack ST N times. In this regard, N is a natural number of 1 or more. In the drawings, there is illustrated the case in which three groups G1 to G3 of preliminary first-holes H1A, H1B and H1C having different depths may be formed by etching the stack ST two times using the second mask pattern 52 including two openings.

Figure 5B:
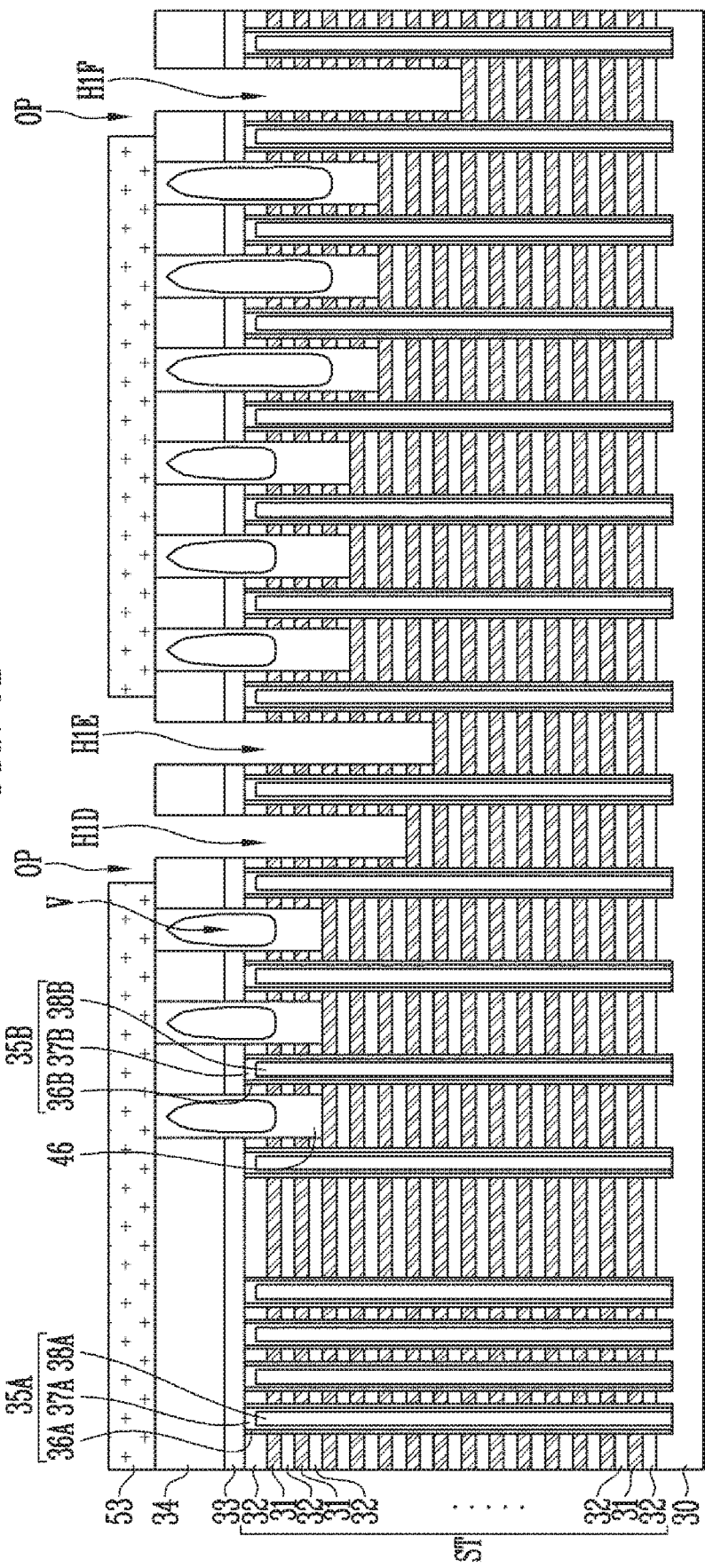

Referring to FIGS. 5A and 5B, the second mask pattern 52A of FIGS. 4A and 4B may be removed, and a third mask pattern 53 including openings OP, through which some preliminary first-holes H1A to H1C are exposed, may be thereafter formed. Each of the openings OP may have a line shape extending in one direction. The openings OP may be disposed to expose the preliminary first-holes H1A to H1C having different depths.

Subsequently, the stack ST may be etched to a predetermined depth using the third mask pattern 53 and the hard mask pattern 34 as etch barriers. For example, since the three groups G1 to G3 of preliminary first-holes H1A to H1C have been formed during the preceding process, three first-material layers 31 and three second-material layers 32 may be etched. In this way, the preliminary first-holes H1A to H1C may extend downward, and the corresponding first material layers 31 may be exposed through the bottoms of the extended preliminary first-holes H1D to H1F.

Referring to FIGS. 6A and 6B, the openings OP of FIGS. 5A and 5B may expand. For instance, the openings OP may be expanded by etching portions of the third mask pattern 53 of FIGS. 5A and 5B. The openings OP may expand in one direction (refer to the arrow), whereby some preliminary first-holes H1A, H1B and H1C may be additionally exposed through the expanded openings OP'.

Subsequently, the stack ST may be etched to a predetermined depth using, as etch barriers, the hard mask pattern 34 and the third mask pattern 53A including the expanded openings OP'. For example, three first-material layers 31 and three second-material layers 32 may be etched. In this way, the preliminary first-holes H1D to H1F may extend downward, so that preliminary first-holes H1D to H1I may be formed.

Referring to FIGS. 7A and 7B, the openings OP' of FIGS. 6A and 6B may expand. For example, the openings OP' may be expanded by etching portions of the third mask pattern 53A of FIGS. 6A and 6B. The openings OP' may expand in one direction (refer to the arrow), whereby some preliminary first-holes H1A, H1B and H1C may be additionally exposed through the expanded openings OP''.

Subsequently, the stack ST may be etched to a predetermined depth using, as etch barriers, the hard mask pattern 34 and a third mask pattern 53B including the expanded openings OP''. For example, three first-material layers 31 and three second-material layers 32 may be etched. In this way, the preliminary first-holes H1A to H1I may extend downward, so that preliminary first-holes H1D to H1L having different depths may be formed. Eventually, the first holes H1A to H1L may be formed.

The third mask pattern 53B may further include openings. The operation of expanding the openings and etching the stack ST to a predetermined depth may be repeatedly performed several times. Since the preliminary first-holes H1A to H1C may be successively exposed as the openings expand, the preliminary first-holes H1A to H1C may extend to various depths.

Figure 8B:
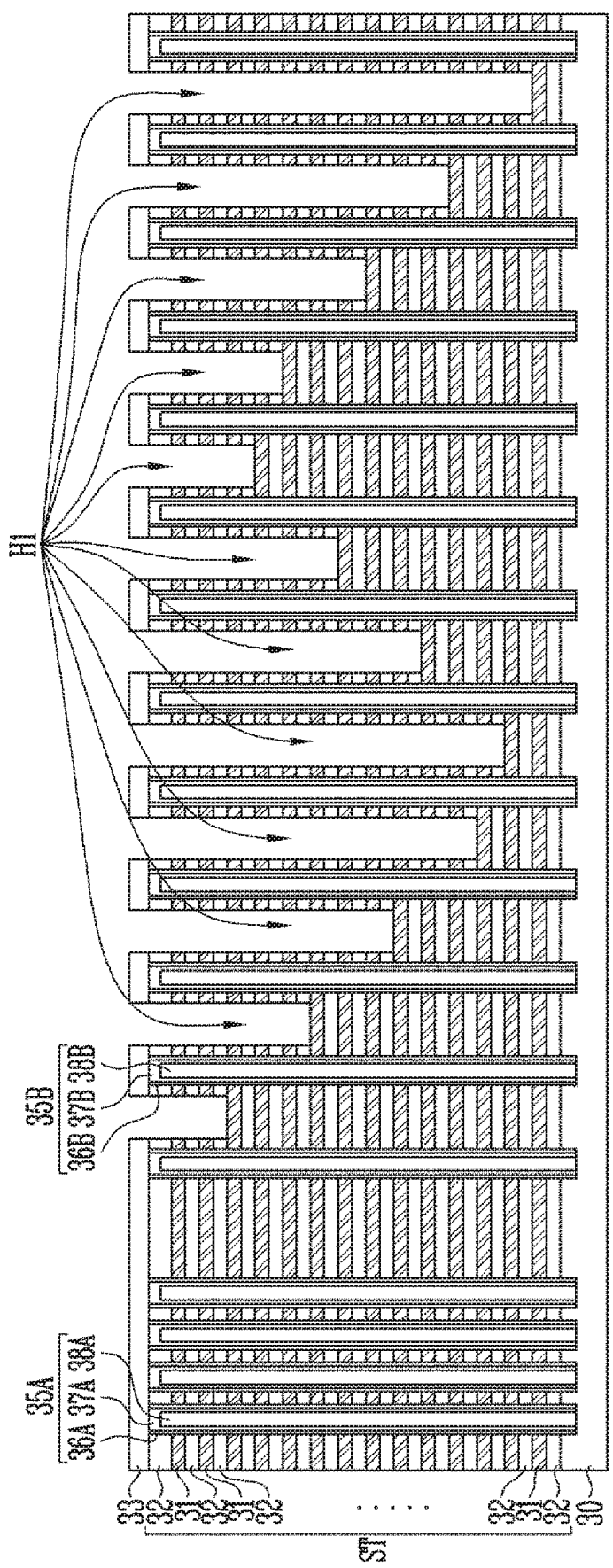

Referring to FIGS. 8A and 8B, the third mask pattern 53B, the hard mask pattern 34 and the sacrificial patterns 46 of FIGS. 7A and 7B may be removed to open all of the first holes H1. Since the first holes H1 have different depths, the first material layers 31 may be exposed through the respective bottoms of the first holes H1.

However, at least one uppermost first material layer 31 may not be exposed through the bottom of any first hole H1. For example, when the at least one uppermost first material layer 31 may be provided to form a drain select line, the first material layer 31 to be used for forming the drain select line may be not exposed through the bottom of any first hole H1.

Referring to FIGS. 9A and 9B, a protective layer 39 may be formed along a profile of the stack ST including the first holes H1. The protective layer 39 may be formed of material having a high etch selectivity to the first materials 31. For instance, when the first material layers 31 are nitride layers, the protective layer 39 may be an oxide layer.

Subsequently, an etch stop layer 40 may be formed on the protective layer 39, and a sacrificial layer 41 may be thereafter formed on the etch stop layer 40. The sacrificial layer 41 may be formed to fill the first-holes H1 and may also be formed on the upper surface of the stack ST. The etch stop layer 40 may include material having a high etch selectivity to the sacrificial layer 41. For instance, the etch stop layer 40 may include $AL_2O_3$, ZrO, or the like. The sacrificial layer 41 may include an oxide layer.

Figure 10A:
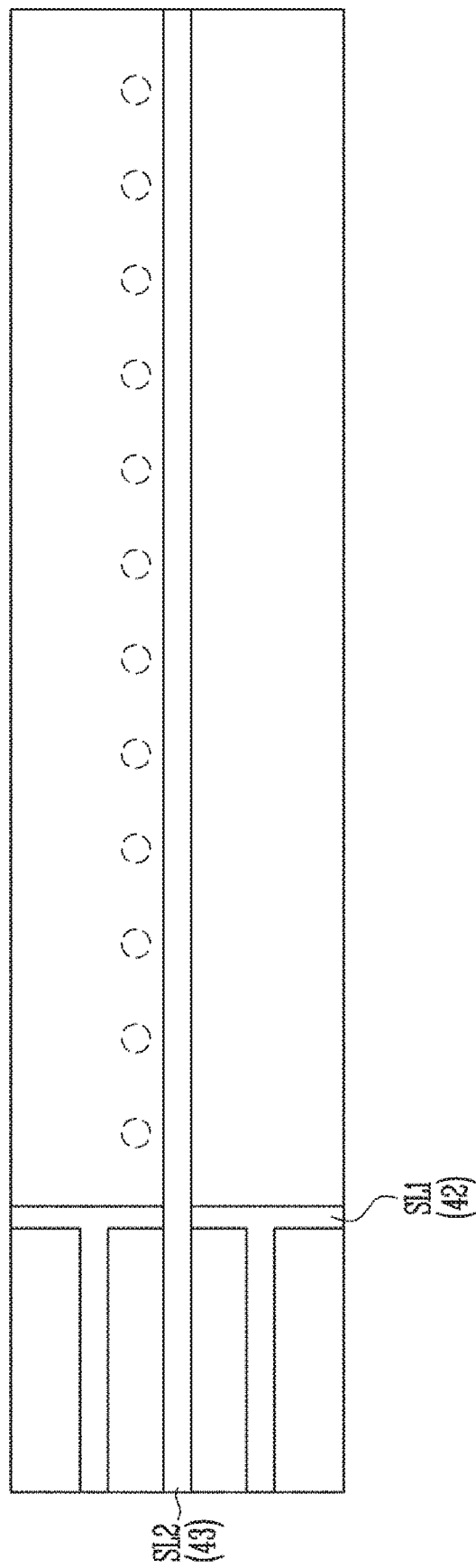
Figure 10B:
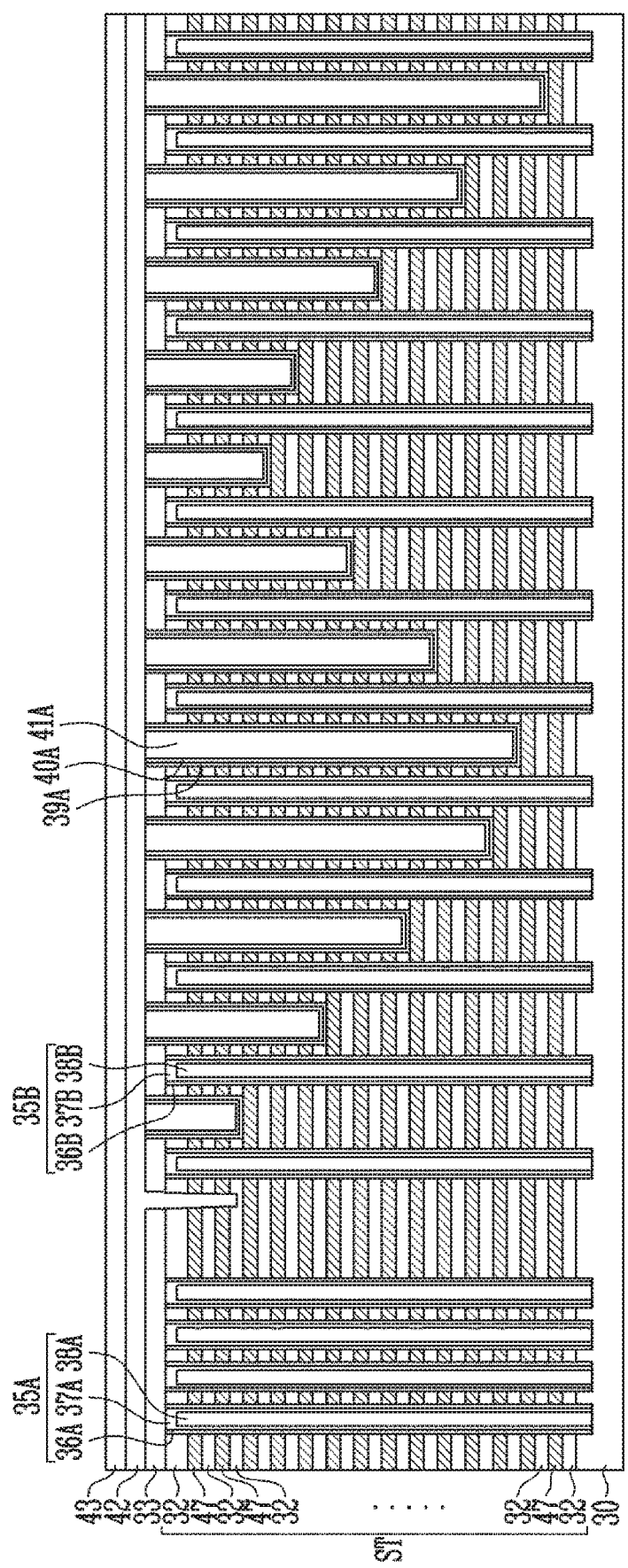

Referring to FIGS. 10A and 10B, the sacrificial layer 41, the etch stop layer 40 and the protective layer 39 of FIGS. 9A and 9B may be planarized, with sacrificial patterns 41A, etch stop patterns 40A, protective patterns 39A formed in the respective first holes H1. A planarization process may be performed until the upper surface of the stack ST or an upper surface of the first interlayer insulating layer 33 may be exposed. Consequently, the portion of the etch stop layer 40 that has been formed over the upper surface of the stack ST may be completely removed, and the etch stop patterns 40A may be formed only in the respective first holes H1. Furthermore, each of the protective patterns 39A may enclose the whole surface of the corresponding etch stop pattern 40A. Space defined inside each etch stop pattern 40A may be filled with the corresponding sacrificial pattern 41A.

Subsequently, a first slit SL1 which passes through a portion of the stack ST may be formed, and a second interlayer insulating layer 42 with which the first slit SL1 is filled may be thereafter formed. Thereafter, a second slit SL2 which passes through the second interlayer insulating layer 42, the first interlayer insulating layer 33 and the stack ST may be formed. The first and second slits SL1 and SL2 may be disposed without overlapping the first holes H1. In detail, there is no etch stop pattern 40A at positions at which the first and second slits SL may be to be formed. Hence, the first and second slits SL1 and SL2 may be easily formed through an etching process. The second slit SL2 may be formed to a predetermined depth such that all of the first material layers 31 may be exposed.

Thereafter, the first material layers 31 of FIGS. 9A and 9B may be replaced with third material layers 47 through the second slit SL2. For example, the first material layers 31 may be selectively removed to form openings, and the third material layers 47 may be thereafter formed in the respective openings. Subsequently, a third interlayer insulating layer 43 may be formed to fill the second slit SL2.

During the process of removing the first material layers 31, the protective patterns 39A may be exposed in the openings. Therefore, when the protective patterns 39A are not present, the etch stop patterns 40A may be exposed in the openings and thus damaged. However, according to the embodiment of the present disclosure, since the protective patterns 39A may enclose the respective etch stop patterns 40A, the etch stop patterns 40A may not be exposed in the respective openings. Therefore, the etch stop patterns 40A may be prevented from being damaged.

The third material layers 47 may be conductive layers including metal such as tungsten. Furthermore, an additional memory layer may be formed in the openings before the third material layers 47 are formed. The memory layer may include at least one of a tunnel insulating layer, a data storage layer and a charge blocking layer, and include a floating gate, a charge trap layer, silicon, nitride, phase-change material, nanodots, etc.

Figure 11B:
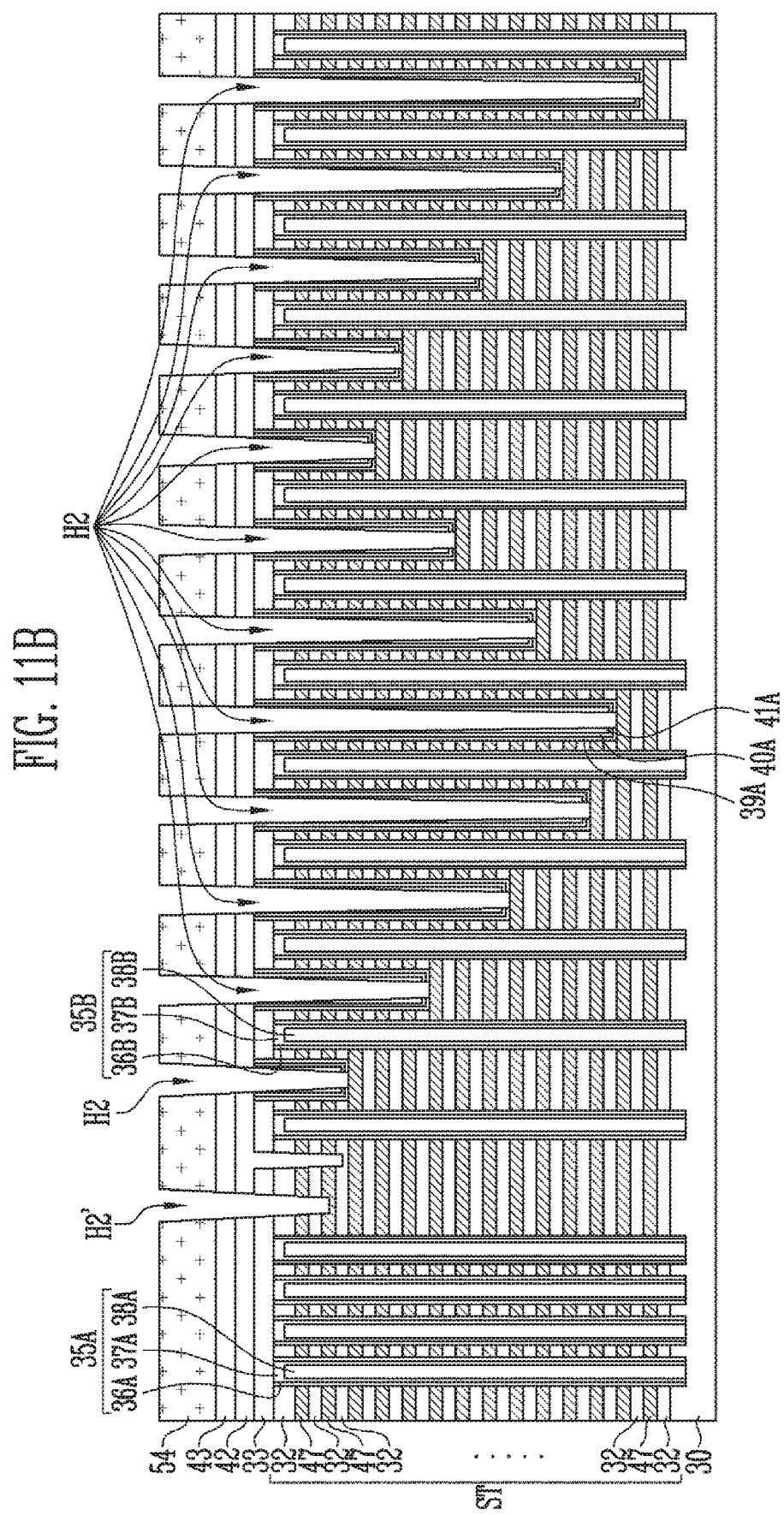

Referring to FIGS. 11A and 11B, a fourth mask pattern 54 may be formed on the third interlayer insulating layer 43. The fourth mask pattern 54 may include openings overlapping the first holes H1. Thereafter, the third interlayer insulating layer 43, the second interlayer insulating layer 42 and the sacrificial patterns 41A may be etched using the fourth mask pattern 54 as an etch barrier. In this way, second holes H2 may be formed such that etch stop patterns 40A may be exposed through the respective bottoms of the second holes H2. Subsequently, the second holes H2 may extend downward to pass through the respective etch stop patterns 40A and expose the respective third material layers 47. For example, excessive etching may be performed using the fourth mask pattern 54 as an etching barrier so that the third material layers 47 may be exposed. Each of the second holes H2 may have a width less than that of each of the first holes H1, and the width of each of the second holes H2 may be gradually reduced from an upper end thereof to a lower end. Furthermore, the sacrificial patterns 41A may remain in the respective first holes H1.

Some of the openings of the fourth mask pattern 54 may be disposed without overlapping the first holes H1, and a second hole H2' may be formed by a corresponding opening. The second hole H2' may be formed to pass through the third interlayer insulating layer 43, the second interlayer insulating layer 42 and a portion of the stack ST. The second hole H2' may have a depth corresponding to the third material layers 47 to be used as the drain select lines. For instance, when one memory string includes two drain select transistors, the second hole H2' may be formed to pass through two third material layers 47 from the uppermost end of the stack ST.

Figure 12B:
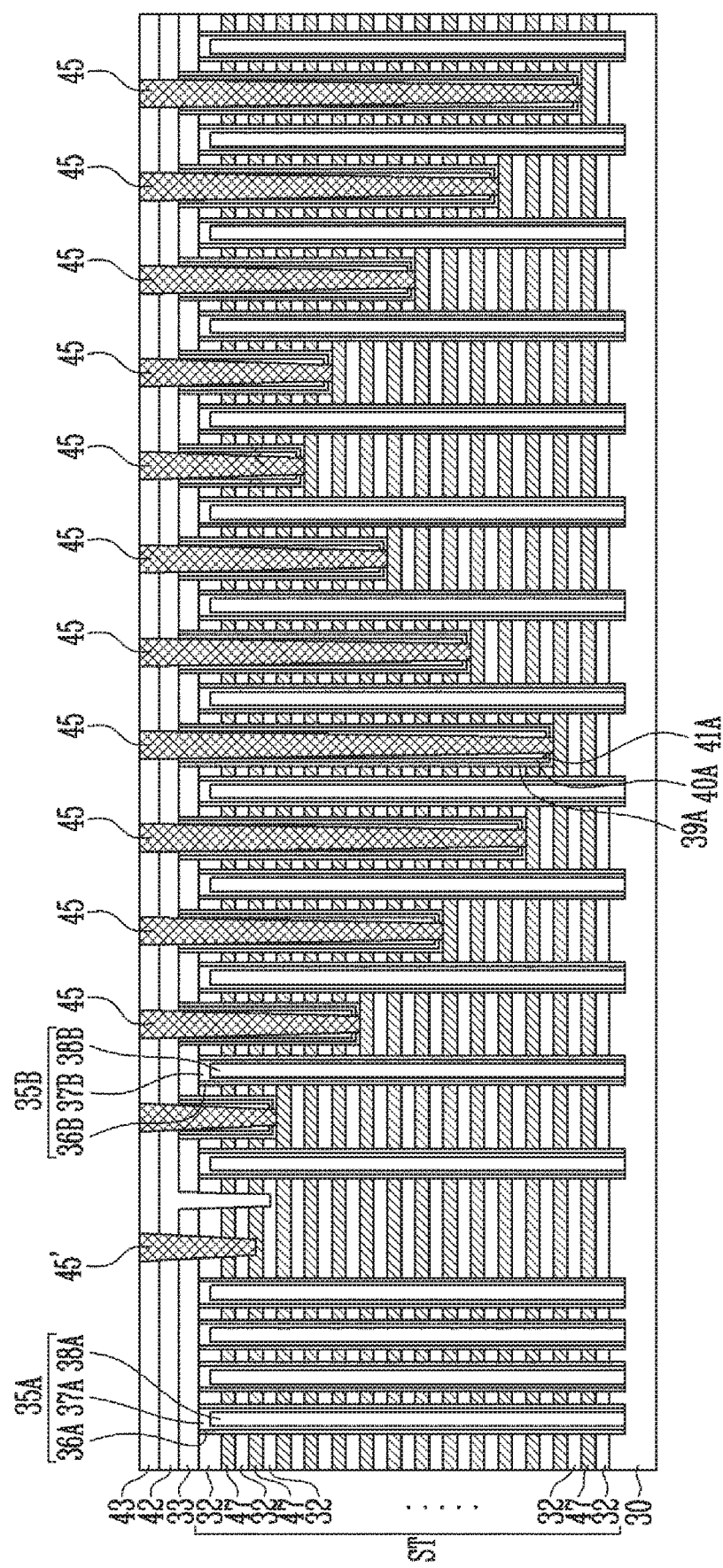

Referring to FIGS. 12A to 12B, conductive layers may be formed in the respective second holes H2. Thereby, contact plugs 45 may be formed to be electrically coupled with the respective third material layers 47. In addition, since an etch stop pattern may not be formed on the sidewall of a contact plug 45', the contact plug 45' may be electrically coupled with all of the third material layers 47 exposed in the second hole H2'. For instance, when one memory string includes two drain select transistors, the contact plug 45' in the second hole H2' may be electrically coupled with two third material layers 47. Therefore, the same bias may be applied to gate electrodes of a plurality of drain select transistors included in one memory string.

Figure 13:
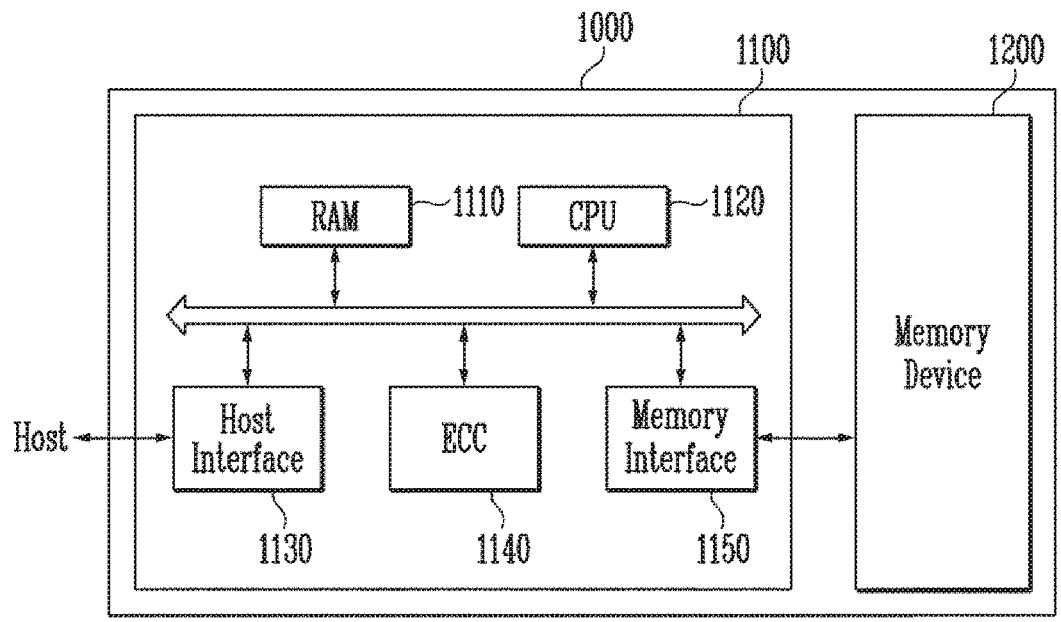
FIGS. 13 and 14 are block diagrams illustrating a memory system in accordance with an embodiment of the present disclosure.

FIG. 13 is a block diagram illustrating the configuration of a memory system 1000 according to an embodiment of the present disclosure.

Referring FIG. 13, the memory system 1000 may include a memory device 1200 and a controller 1100.

The memory device 1200 may be used to store data information having a variety of data forms such as text, graphics, and software codes. The memory device 1200 may be a nonvolatile memory. Furthermore, the memory device 1200 may have the structure described above with reference to FIGS. 1A to 12B, and may be manufactured by the manufacturing method described above with reference to FIGS. 1A to 12B. In an embodiment, the memory device 1200 may include a stack including conductive layers and insulating layers which are alternately stacked; contact plugs passing through the stack to different depths; etch stop patterns enclosing respective sidewalls of the contact plugs; and protective patterns enclosing the respective etch stop patterns. The contact plugs may pass through the respective etch stop patterns and the respective protective patterns, and be electrically coupled with the respective conductive layers. The structure of the memory device 1200 and the manufacturing method thereof are the same as those described above; therefore a detailed description thereof will be omitted.

The controller 1100 may be coupled to a host Host and the memory device 1200. The controller 1100 may access the memory device 1200 in response to a request from the host Host. For example, the controller 1100 may control read, write, erase, and background operations of the memory device 1200.

The controller 1100 may include a random access memory (RAM) 1110, a central processing unit (CPU) 1120, a host interface 1130, an error correction code (ECC) circuit 1140, a memory interface 1150.

The RAM 1110 may be used as an operation memory of the CPU 1120, a cache memory between the memory device 1200 and the host Host, a buffer memory between the memory device 1200 and the host Host, and so forth. For reference, the RAM 1110 may be replaced with a static random access memory (SRAM), a read only memory (ROM), or the like.

The CPU 1120 may control the overall operation of the controller 1100. For example, the CPU 1120 may be configured to operate firmware such as a flash translation layer (FTL) stored in the RAM 1110.

The host interface 1130 may be configured to interface with the host Host. For example, the controller 1100 may be configured to communicate with the host Host through at least one of various interface protocols such as a universal serial bus (USB) protocol, a multimedia card (MMC) protocol, a peripheral component interconnection (PCI) protocol, a PCI express (PCIe) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The ECC circuit 1140 may use an error correction code (ECC) to detect and correct errors in data read from the memory device 1200.

The memory interface 1150 may be configured to interface with the memory device 1200. For example, the memory interface 1150 may include a NAND interface or a NOR interface.

For reference, the controller 1100 may further include a buffer memory (not shown) for temporarily storing data. The buffer memory may be used to temporarily store data to be received from the host interface 1130 to an external device or data to be received from the memory interface 1150 to the memory device 1200. In addition, the controller 1100 may further include a read only memory (ROM) that stores code data for interfacing with the host Host.

Since the memory system 1000 according to the embodiment may include the memory device 1200 having improved integration and characteristics, the integration and characteristics of the memory system 1000 may also be improved.

Figure 14:
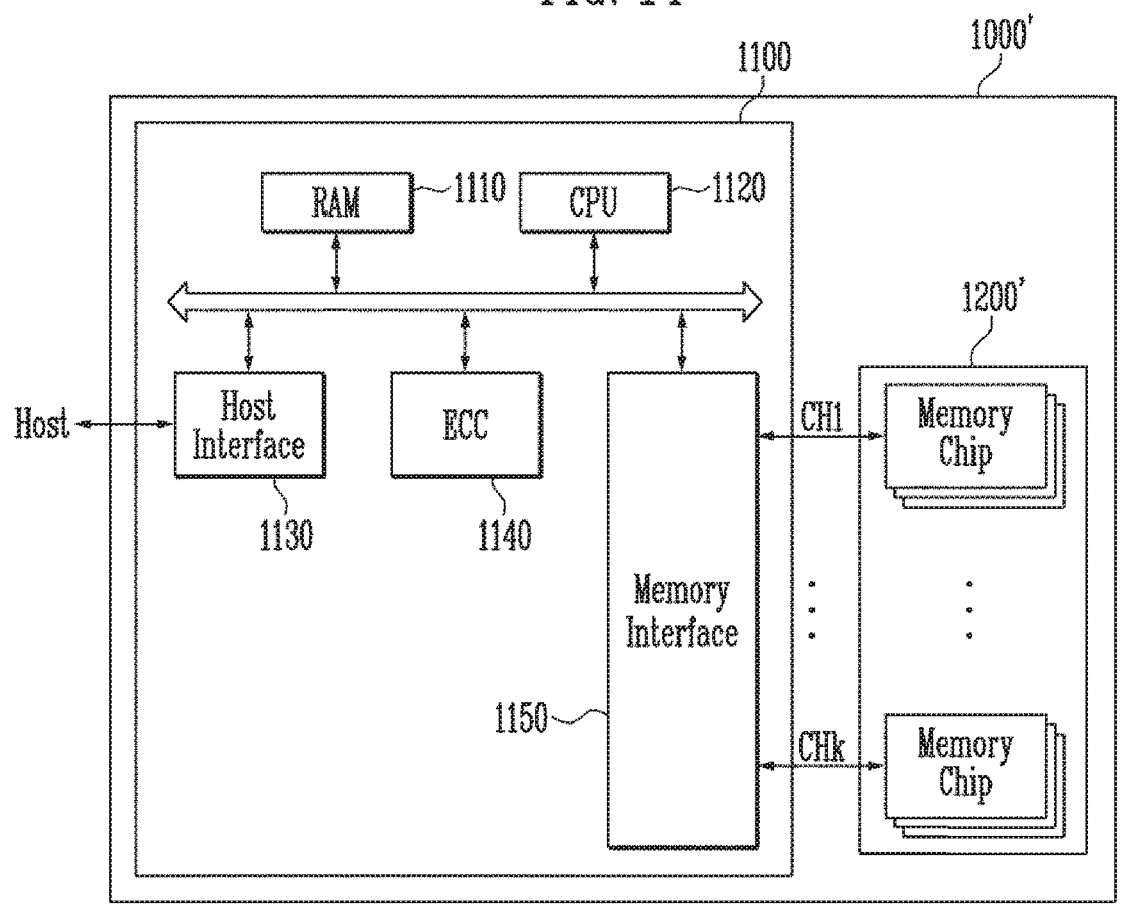

FIG. 14 is a block diagram showing the configuration of a memory system 1000' according to an embodiment of the present disclosure. Hereinbelow, repetitive descriptions will be omitted if deemed redundant.

Referring to FIG. 14, the memory system 1000' may include a memory device 1200' and a controller 1100. The controller 1100 includes a random access memory (RAM) 1110, a central processing unit (CPU) 1120, a host interface 1130, an error correction code (ECC) circuit 1140, a memory interface 1150, and so on.

The memory device 1200' may be a nonvolatile memory. Furthermore, the memory device 1200' may have the structure described above with reference to FIGS. 1A to 12B, and may be manufactured by the manufacturing method described above with reference to FIGS. 1A to 12B. In an embodiment, the memory device 1200' may include a stack including conductive layers and insulating layers which are alternately stacked; contact plugs passing through the stack to different depths; etch stop patterns enclosing respective sidewalls of the contact plugs; and protective patterns enclosing the respective etch stop patterns. The contact plugs may pass through the respective etch stop patterns and the respective protective patterns, and be electrically coupled with the respective conductive layers. The structure of the memory device 1200' and the manufacturing method thereof are the same as those described above; therefore a detailed description thereof will be omitted.

Furthermore, the memory device 1200' may be a multi-chip package including a plurality of memory chips. The plurality of memory chips may be divided into a plurality of groups. The plurality of groups may be configured to communicate with the controller 1100 through first to k-th channels CH1 to CHk. The memory chips of each group may communicate with the controller 1100 through a common channel. For reference, the memory system 1000' may be modified such that each single memory chip is coupled to a corresponding single channel.

As described above, since the memory system 1000' according to the embodiment may include the memory device 1200' having improved integration and characteristics, the integration and characteristics of the memory system 1000' may also be improved. In particular, the memory device 1200' according to the present embodiment may be formed of a multi-chip package, whereby the data storage capacity and the operating speed thereof can be enhanced.

Figure 15:
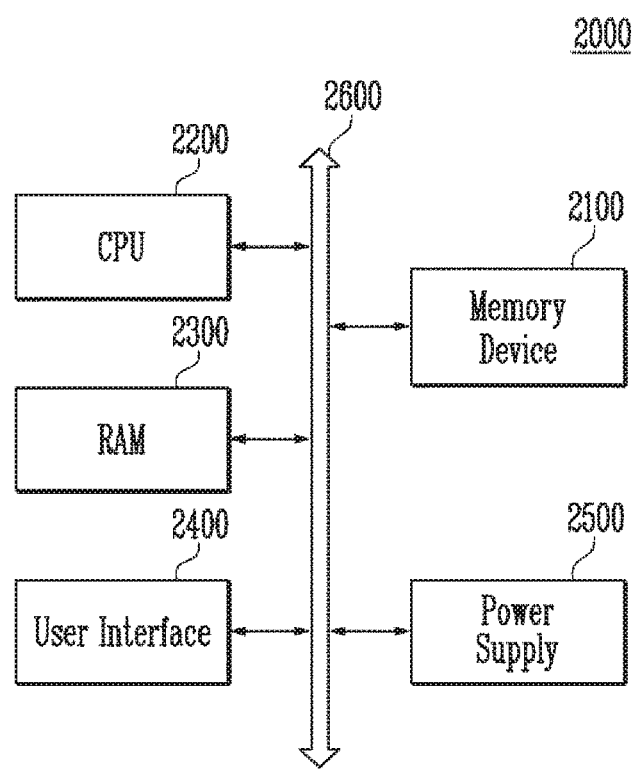
FIGS. 15 and 16 are block diagrams illustrating a computing system in accordance with an embodiment of the present disclosure.

FIG. 15 is a block diagram showing the configuration of a computing system 2000 according to an embodiment of the present disclosure. Hereinbelow, repetitive descriptions will be omitted if deemed redundant.

Referring to FIG. 15, the computing system 2000 may include a memory device 2100, a central processing unit (CPU) 2200, a random access memory (RAM) 2300, a user interface 2400, a power supply 2500, a system bus 2600, and so forth.

The memory device 2100 may store data provided via the user interface 2400, data processed by the CPU 2200, etc. Furthermore, the memory device 2100 may be electrically coupled to the CPU 2200, the RAM 2300, the user interface 2400, the power supply 2500, etc. by the system bus 2600. For example, the memory device 2100 may be coupled to the system bus 2600 via a controller (not shown) or, alternatively, directly coupled to the system bus 2600. When the memory device 2100 is directly coupled to the system bus 2600, the function of the controller may be performed by the CPU 2200, the RAM 2300, etc.

The memory device 2100 may be a nonvolatile memory. Furthermore, the memory device 2100 may have the structure described above with reference to FIGS. 1A to 12B, and may be manufactured by the manufacturing method described above with reference to FIGS. 1A to 12B. In an embodiment, the memory device 2100 may include a stack including conductive layers and insulating layers which are alternately stacked; contact plugs passing through the stack to different depths; etch stop patterns enclosing respective sidewalls of the contact plugs; and protective patterns enclosing the respective etch stop patterns. The contact plugs may pass through the respective etch stop patterns and the respective protective patterns and be electrically coupled with the respective conductive layers. The structure of the memory device 2100 and the manufacturing method thereof are the same as those described above; therefore detailed descriptions thereof will be omitted.

As described above with reference to FIG. 14, the memory device 2100 may be a multi-chip package configured with a plurality of memory chips.

The computing system 2000 having the above-mentioned configuration may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or the like.

As described above, since the computing system 2000 may include the memory device 2100 having improved integration and characteristics, the characteristics of the computing system 2000 may also be improved.

Figure 16:
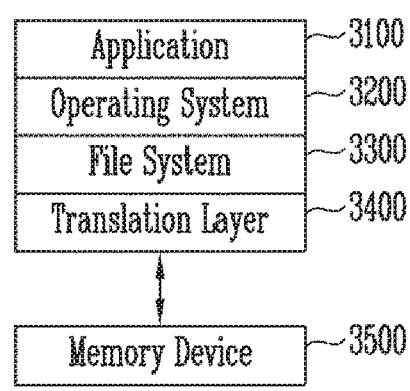

FIG. 16 is a block diagram illustrating a computing system 3000 according to an embodiment of the present disclosure.

Referring to FIG. 16, the computing system 3000 may include a software layer which has an operating system 3200, an application 3100, a file system 3300, a translation layer 3400, and so forth. Furthermore, the computing system 3000 may include a hardware layer such as a memory device 3500.

The operating system 3200 may manage software resources and hardware resources, etc. of the computing system 3000 and may control program execution by the central processing unit (CPU). The application 3100 may be various application programs executed in the computing system 3000 and may be a utility executed by the operating system 3200.

The file system 3300 may refer to a logical structure for controlling data, files, etc. which are present in the computing system 3000 and may organize files or data to be stored in the memory device 3500 or the like according to a given rule. The file system 3300 may be determined depending on the operating system 3200 used in the computing system 3000. For example, if the operating system 3200 is Microsoft's Windows system, the file system 3300 may be a file allocation table (FAT), an NT file system (NTFS), or the like. If the operating system 3200 is a Unix/Linux system, the file system 3300 may be an extended file system (EXT), a Unix file system (UFS), a journaling file system (JFS), or the like.

Although the operating system 3200, the application 3100 and the file system 3300 are expressed by separate blocks in the drawing, the application 3100 and the file system 3300 may be included in the operating system 3200.

The translation layer 3400 may translate an address into a suitable form for the memory device 3500 in response to a request from the file system 3300. For example, the translation layer 3400 may translate a logical address produced by the file system 3300 into a physical address of the memory device 3500. Mapping information of the logical address and the physical address may be stored in an address translation table. For example, the translation layer 3400 may be a flash translation layer (FTL), a universal flash storage link layer (ULL), or the like.

The memory device 3500 may be a nonvolatile memory. Furthermore, the memory device 3500 may have the structure described above with reference to FIGS. 1A to 12B, and may be manufactured by the manufacturing method described above with reference to FIGS. 1A to 12B. In an embodiment, the memory device 3500 may include a stack including conductive layers and insulating layers which are alternately stacked; contact plugs passing through the stack to different depths; etch stop patterns enclosing respective sidewalls of the contact plugs; and protective patterns enclosing the respective etch stop patterns. The contact plugs may pass through the respective etch stop patterns and the respective protective patterns, and be electrically coupled with the respective conductive layers. The structure of the memory device 3500 and the manufacturing method thereof are the same as those described above; therefore a detailed description thereof will be omitted.

The computing system 3000 having the above-mentioned configuration may be divided into an operating system layer implemented in an upper level region and a controller layer implemented in a lower level region. The application 3100, the operating system 3200, and the file system 3300 may be included in the operating system layer, and may be driven by an operating memory of the computing system 3000. The translation layer 3400 may be included in the operating system layer or the controller layer.

As described above, since the computing system 3000 according to the embodiment may include the memory device 3500 having improved integration and characteristics, the characteristics of the computing system 3000 may also be improved.

The present disclosure may provide a semiconductor device having a stable structure and improved reliability. In manufacturing the semiconductor device, the manufacturing process may be facilitated, and a procedure thereof may be simplified, and the manufacturing cost may be reduced.

Examples of embodiments have been disclosed herein, and although specific terms are employed, the terms are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
   a stack including at least one conductive layer and at least one insulating layer which are alternately stacked;
   contact plugs passing through the stack to different depths;
   etch stop patterns enclosing respective sidewalls of the contact plugs; and
   protective patterns enclosing the respective etch stop patterns,
   wherein the contact plugs pass through the etch stop patterns and the protective patterns, and are electrically coupled with the at least one conductive layer.

2. The semiconductor device according to claim 1, further comprising:
   sacrificial patterns interposed between the contact plugs and the etch stop patterns.

3. The semiconductor device according to claim 2, wherein upper surfaces of the etch stop patterns and upper surfaces of the protective patterns are disposed lower than upper surfaces of the contact plugs.

4. The semiconductor device according to claim 1, further comprising:
   channel layers passing through the stack.

5. The semiconductor device according to claim 4, wherein upper surfaces of the channel layers are lower than upper surfaces of the etch stop patterns.

6. The semiconductor device according to claim 4, wherein upper surfaces of the channel layers are lower than upper surfaces of the protective patterns.

7. The semiconductor device according to claim 1, further comprising:
   dummy channel layers passing through the stack.

8. The semiconductor device according to claim 7, wherein the contact plugs are located between the dummy channel layers.

9. A semiconductor device comprising:
   a stack including conductive layers and insulating layers which are alternately stacked;
   a first contact plug passing through the stack to a first depth;
   a first etch stop pattern enclosing a sidewall of the first contact plug;
   a first protective pattern enclosing the first etch stop pattern;
   a second contact plug passing through the stack to a second depth deeper than the first depth;
   a second etch stop pattern enclosing a sidewall of the second contact plug; and
   a second protective pattern enclosing the second etch stop pattern,
   wherein the first contact plug passes through the first etch stop pattern and the first protective pattern, and is electrically coupled with a first conductive layer among the conductive layers.

10. The semiconductor device according to claim 9, wherein the second contact plug passes through the second etch stop pattern and the second protective pattern, and is electrically coupled with a second conductive layer among the conductive layers.

11. The semiconductor device according to claim 10, wherein the second conductive layer is located lower than the first conductive layer.

12. The semiconductor device according to claim 9, further comprising:
    a first sacrificial pattern interposed between the first contact plug and the first etch stop pattern.

13. The semiconductor device according to claim 9, wherein an upper surface of the first etch stop pattern and an upper surface of the second etch stop pattern are located at substantially the same level.

14. The semiconductor device according to claim 13, wherein a lower surface of the second etch stop pattern is located lower than a lower surface of the first etch stop pattern.

15. The semiconductor device according to claim 9, further comprising:
    a channel layer passing through the stack.

16. The semiconductor device according to claim 15, wherein an upper surface of the channel layer is lower than an upper surface of the first etch stop pattern.

17. The semiconductor device according to claim 15, wherein an upper surface of the channel layer is lower than an upper surface of the first protective pattern.

18. The semiconductor device according to claim 9, further comprising:
    dummy channel layers passing through the stack.

19. The semiconductor device according to claim 18, wherein the first contact plug is located between the dummy channel layers.

* * * * *